United States Patent
Sun et al.

(10) Patent No.: US 11,223,335 B2
(45) Date of Patent: Jan. 11, 2022

(54) INVERTER STACKING AMPLIFIER

(71) Applicant: BOARD OF REGENTS, THE UNIVERSITY OF TEXAS SYSTEM, Austin, TX (US)

(72) Inventors: Nan Sun, Austin, TX (US); Linxiao Shen, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 116 days.

(21) Appl. No.: 16/614,625

(22) PCT Filed: Jun. 4, 2018

(86) PCT No.: PCT/US2018/035796
§ 371 (c)(1),
(2) Date: Nov. 18, 2019

(87) PCT Pub. No.: WO2018/223113
PCT Pub. Date: Dec. 6, 2018

(65) Prior Publication Data
US 2020/0186106 A1 Jun. 11, 2020

Related U.S. Application Data

(60) Provisional application No. 62/514,684, filed on Jun. 2, 2017.

(51) Int. Cl.
*H03F 3/16* (2006.01)
*H03F 3/45* (2006.01)
(Continued)

(52) U.S. Cl.
CPC ............... *H03F 3/16* (2013.01); *H03F 1/26* (2013.01); *H03F 3/3015* (2013.01);
(Continued)

(58) Field of Classification Search
CPC ........... H03F 3/16; H03F 1/26; H03F 3/3015; H03F 3/45475; H03F 2203/45544;
(Continued)

(56) References Cited

U.S. PATENT DOCUMENTS 7,944,307 B2 * 5/2011 Goldfarb ................. H03F 3/211
330/295
8,884,662 B2 * 11/2014 Ancis ................. H03K 19/0019
327/112

(Continued)

OTHER PUBLICATIONS

International Search Report and Written Opinion in PCT/US2018/035796. dated Sep. 20, 2018. 12 pages.
(Continued)

*Primary Examiner* — Hieu P Nguyen
(74) *Attorney, Agent, or Firm* — Meunier Carlin & Curfman LLC

(57) ABSTRACT

The exemplified disclosure presents a highly power efficient amplifier (e.g., front-end inverter and/or amplifier) that achieves significant current reuse (e.g., 6-time for a 3-stack embodiments) by stacking inverters and splitting the capacitor feedback network. In some embodiments, the exemplified technology facilitates N-time current reuse to substantially reduced power consumption. It is observed that the exemplified disclosure facilitates significant current-reuse operation that significantly boost gain gm while providing low noise performance without increasing power usage. In addition, the exemplified technology is implemented such that current reuse and number of transistor has a generally linear relationship and using fewer transistors as compared to known circuits of similar topology.

20 Claims, 19 Drawing Sheets

(51) Int. Cl.
*H03F 1/26* (2006.01)
*H03F 3/30* (2006.01)
*H03G 1/00* (2006.01)
*H03F 1/02* (2006.01)

(52) U.S. Cl.
CPC ....... *H03F 3/45475* (2013.01); *H03G 1/0029* (2013.01); *H03F 2203/45544* (2013.01)

(58) Field of Classification Search
CPC . H03F 2203/45526; H03F 2203/45548; H03F 1/3211; H03F 3/211; H03F 3/195; H03G 1/0029
USPC .............................. 330/252–261, 295, 124 R
See application file for complete search history.

(56) References Cited

U.S. PATENT DOCUMENTS 9,503,036 B2 * 11/2016 Hwang .................... H03F 3/211
10,637,418 B2 * 4/2020 Emira ........................ H03F 3/24

2013/0169364 A1 7/2013 Cha et al.
2016/0149548 A1 5/2016 Gorecki et al.

OTHER PUBLICATIONS

Chen et al., A 266nW multi-chopper amplifier with 1.38 noise efficiency factor for neural signal recording, Jul. 21, 2014.
Arshad et al. A sub-10mW, noise cancelling, wideband LNA for UWB applications, Aug. 6, 2014.
Yaul et al. A sub-uW 36nV/square root Hz chopper amplifier for Sensors using a Noise-efficient Inverter-Based 0.2V-Supply Input Stage, Feb. 1, 2016.
Shen et al., A 1-V 0.25-uW Inverter Stacking Amplifier With 1.07 Noise Efficiency Factor, Jan. 9, 2018.
Shen L. et al., A 1-V 0.25-uW Inverter Stacking Amplifier With 1.07 Noise Efficiency Factor, Aug. 15, 2017.
Mondal et al., An ECG Chopper Amplifier Achieving 0.92 NEF and 0.85 PEF with AC-coupled Inverter-Starking for Noise Efficiency Enhancement, Sep. 28, 2017.

* cited by examiner

INVERTER STACKING AMPLIFIER

RELATED APPLICATIONS

This is a 371 application of International PCT application no. PCT/US2018/035796, filed Jun. 4, 2018, titled "Inverter Stacking Amplifier," which claims priority to, and the benefit of, U.S. Provisional Application No. 62/514,684, filed Jun. 2, 2017, titled "Inverter Stacking Amplifier", each of which is incorporated by reference herein in its entirety.

GOVERNMENT LICENSE RIGHTS

This invention was made with government support under Grant Nos. 1254459, 1509767, and 1527320 awarded by the National Science Foundation. The Government has certain rights in the invention.

FIELD OF THE INVENTION

Embodiments described herein relate generally to an inverter amplifier, in particular, an inverter stacking amplifier.

BACKGROUND

Amplifiers are used with sensors to increase the resolution and dynamic range of a signal generated from the sensors. These amplifiers are also referred to as front end amplifiers because they are often the first active circuit element used in the signal processing of a given signal.

A front-end amplifier typically dominates the overall noise and power performance of a sensor system with the fundamental tradeoff being between noise and power for the amplifier. That is, to suppress the noise below a certain target, it may be necessary for the amplifier to consume a certain amount of power. To this end, for certain low-noise sensor applications, the front-end amplifier may take up a significant portion of the overall system power budget. Further, power use may not scale with technology scaling because of such noise limitation.

SUMMARY

The exemplified disclosure presents a highly power efficient amplifier (e.g., front-end inverter and/or amplifier) that achieves significant current reuse (e.g., 6-time for a 3-stack embodiments) by vertically stacking inverters and splitting the capacitor feedback network. Indeed, the exemplified amplifier can decrease the product of power and noise for an amplifier and, thus, for the same noise, the amplifier power can be reduced, or for the same power, the amplifier noise can be minimized.

Particularly for power and energy constrained applications, minimizing this tradeoff may open up new applications with highly stringent requirements, for example, on battery life and heat dissipation. In some embodiments, the exemplified amplifier provides a 6-time current reuse under 1 V supply that provides high NEF performance with low hardware cost. The exemplified amplifier may be used as the front-end amplifier for various applications that have stringent power or energy requirement, including, but not limited to, biomedical implants, wearable technologies, Internet-of-Things technologies, and wireless sensors.

In some embodiments, the exemplified amplifier facilitates 2N-time current reuse for a single channel input. The exemplified amplifier can substantially reduce power consumption, yielding in some embodiment, a noise-efficiency factor (NEF) of 1.07 (an exemplary device is disclosed that is fabricated in 180 nm CMOS; the prototype is observed to have a 5.5 uV$_{rms}$ noise within 10 kHz bandwidth (BW) while consuming only 0.25 uW). It is observed that the exemplified disclosure facilitates significant current-reuse operation that significantly boost gain g$_m$ while providing low noise performance without increasing power usage. In addition, the exemplified technology is implemented such that current reuse and number of transistor has a generally, or mild, linear relationship while using fewer transistors as compared to known circuits of similar topology (e.g., having only N-output current branches that would be combined). This design can thus facilitate scalability and efficient operation (e.g., having a low NEF).

The exemplified amplifier may be suitable in a closed-loop capacitive feedback configuration. The required AC coupling to the multiple amplifier input nodes, in some embodiments, is realized by splitting the input and feedback capacitors into multiple paths that does not require any additional hardware (thus minimizing chip power and area). In some embodiments, to minimize the requirement on the power supply voltage, the tail current sources between stacked inverters are eliminated while maintaining CMRR and PSRR performance. In some embodiments, a replica circuit is used to ensure that input pairs with tight coupling are robustly biased against process, voltage, and temperature (PVT) variations.

In an aspect, an apparatus is disclosed comprising an array of N stacked inverters having capacitive feedback split across N feedback paths to provide 2N-time current reuse for a single channel input. The apparatus includes an array of inverter-based transconductors (e.g., CMOS inverter-based transconductor) comprising a first inverter-based transconductor and a second inverter-based transconductor vertically stacked with respect to the first inverter-based transconductor, the array of inverter-based transconductors being coupled to a summing circuit (e.g. a plurality of common-gate transistors) configured to combine currents outputted from each respective inverter-based transconductor of the array; and a capacitive feedback network comprising a plurality of capacitive elements, wherein the capacitive feedback network is coupled to the combined current outputs of the array of inverter-based transconductor and is split into paths corresponding to a number of inverter-based transconductor in the array such that a voltage input stage of the array of inverter-based transconductor is AC-coupled to each invertor-based transconductor stage of the array.

In some embodiments, the array of inverter-based transconductors includes a third inverter-based transconductor, the third inverter-based transconductor being vertically stacked with respect to the second inverter-based transconductor, the third inverter-based transconductor being coupled to a common-gate transistors of the plurality of common-gate transistors to combine current outputted from the third inverter-based transconductor along with the current output of the first and second inverter-based transconductors.

In some embodiments, the apparatus is configured to generate 2N times current reuse for an N-stage inverter-based transconductor array.

In some embodiments, the apparatus is configured to generate 6 times current reuse for a 3-stage inverter-based transconductor array.

In some embodiments, the summing circuit includes a plurality of common-gate transistors configured to combine currents outputted from each respective inverter-based transconductor of the array.

In some embodiments, the N-stage inverter-based transconductor array is selected from the group consisting of a 2-stage inverter-based transconductor array, a 3-stage inverter-based transconductor array, a 4-stage inverter-based transconductor array, a 5-stage inverter-based transconductor array, and a 6-stage inverter-based transconductor array.

In some embodiments, each inverter-based transconductor of the array comprises an N-MOS pair forming a top inverter and a P-MOS pair coupled to the N-MOS pair to form a bottom inverter.

In some embodiments, the invertor-based transconductor stage is configured to receive a differential-mode input.

In some embodiments, connection nodes between the first inverter-based transconductor and the second inverter-based transconductor is used as a virtual ground.

In some embodiments, the invertor-based transconductor stage is configured to receive a common-mode input.

In some embodiments, the apparatus is configured to generate a gain of an input signal between about 25.4 dB and about 25.6 dB with about 0.23 µW and 0.25 µW of power.

In some embodiments, the array of inverter-based transconductors has N outputs corresponding to an N number of inverter stages.

In some embodiments, the apparatus further comprises a first current source and a second current source, the first and second current sources being coupled to a top node and a bottom node array of inverter-based transconductors so as to isolate the array from respective power lines.

In some embodiments, the array of inverter-based transconductors is coupled to a same single power supply.

In some embodiments, the apparatus has a noise efficiency factor of 1.07 or less.

In another aspect, an amplifier is disclosed comprising: an array of N stacked inverters having capacitive feedback split across N feedback paths to provide 2N-time current reuse for a single channel input, each N stack inverter of the array comprising an inverter-based transconductors (e.g., CMOS inverter-based transconductor) vertically stacked with respect to each other, the array of inverter-based transconductors being coupled to a summing circuit configured to combine currents outputted from each respective inverter-based transconductor of the array; and a capacitive feedback network comprising a plurality of capacitive elements, wherein the capacitive feedback network is coupled to the combined current outputs of the array of inverter-based transconductor and is split into paths corresponding to a number of inverter-based transconductor in the array such that a voltage input stage of the array of inverter-based transconductor is AC-coupled to each invertor-based transconductor stage of the array.

In some embodiments, the amplifier is configured to generate 2N times current reuse for an N-stage inverter-based transconductor array.

In some embodiments, the array of inverter-based transconductors has N outputs corresponding to an N number of inverter stages.

In another aspect, a system is disclosed comprising: a sensor; and an amplifier, the amplifier comprising an array of N stacked inverters having capacitive feedback split across N feedback paths to provide 2N-time current reuse for a single channel input, each N stack inverter of the array comprising an inverter-based transconductors (e.g., CMOS inverter-based transconductor) vertically stacked with respect to each other, the array of inverter-based transconductors being coupled to a summing circuit configured to combine currents outputted from each respective inverter-based transconductor of the array; and a capacitive feedback network comprising a plurality of capacitive elements, wherein the capacitive feedback network is coupled to the combined current outputs of the array of inverter-based transconductor and is split into paths corresponding to a number of inverter-based transconductor in the array such that a voltage input stage of the array of inverter-based transconductor is AC-coupled to each invertor-based transconductor stage of the array.

In some embodiments, the amplifier is configured to generate 2N times current reuse for an N-stage inverter-based transconductor array.

BRIEF DESCRIPTION OF DRAWINGS

Embodiments of the present invention may be better understood from the following detailed description when read in conjunction with the accompanying drawings. Such embodiments, which are for illustrative purposes only, depict novel and non-obvious aspects of the invention. The drawings include the following figures.

DETAILED SPECIFICATION

Each and every feature described herein, and each and every combination of two or more of such features, is included within the scope of the present invention provided that the features included in such a combination are not mutually inconsistent.

Figure 1:
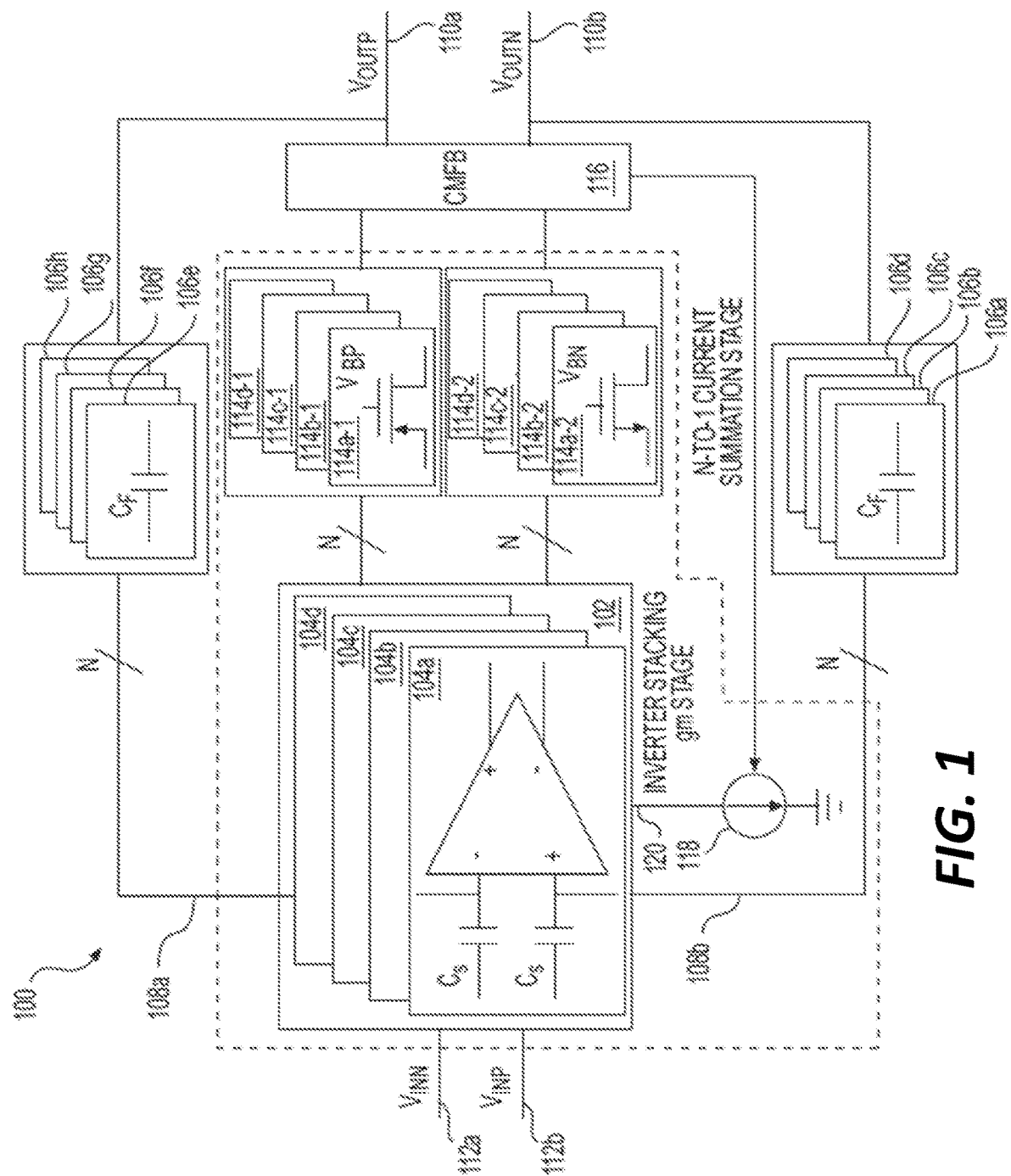
FIG. 1 is a block diagram of an exemplary closed-loop inverter-stack array (ISA), in accordance with an illustrative embodiment.

FIG. 1 is a block diagram of an exemplary inverter-stack array (ISA) 100 configured in closed-loop operation for a single channel input, in accordance with an illustrative embodiment. The inverter-stack array (ISA) 100 includes an array of N stacked inverters (shown as a stacked inverter core 102 with N number of inverters 104a-104d) having capacitive feedback (shown as 106a-106h) split across N feedback paths (shown 108a, 108b) of each differential output (shown as "$V_{OUTP}$" 110a, "$V_{OUTN}$" 110b) to provide 2N-time current reuse. In some embodiments, each stacked inverter (e.g., 104a-104d) is implemented as a vertically stacked inverter-based transconductor. The inputs of the inverter-stack array 100 are shown as "$W_{INN}$" 112a and "$V_{INP}$" 112b. Although shown with four inverters, it is contemplated that N number of stacked inverters may be used (e.g., 2, 3, 4, 5, 6, 8, 9, 10, 11, 12, 13, 14, 15, 16, or more vertically stacked inverter-based transconductors).

Referring still to FIG. 1, the N stacked inverters (e.g., 104a-104d) are coupled to an N-to-1 current summation stage that comprises N number of common-gate transistor pairs (shown as pair 114a-1 and 114a-2, pair 114b-1 and 114b-2, pair 114c-1 and 114c-2, and pair 114d-1 and 114d-2) configured to add up output currents from each stacked inverter (e.g., each transconductor). The current summation stage provides a common-mode feedback output (shown as "CMFB" 116) to regulate a current source 118 coupled to a tail section 120 of the N stacked inverters (e.g., 104a-104d).

The capacitive feedback network (e.g., 106a-106h) is split into N paths (e.g., 108a, 108b) with the input 112a, 112b being AC-coupled to each individual transconductor such that the inverter-stack array has a closed-loop feedback in which the bias current is reused by 2N times. As shown, the capacitive feedback network comprises a N capacitive elements that are each coupled to the combined current outputs of the array of inverter-based transconductor and is split into paths corresponding to a number of inverter-based transconductor in the array such that a voltage input stage of the array of inverter-based transconductor is AC-coupled to each invertor-based transconductor stage of the array.

Example: 2-Stack Inverter Stack Array

Figure 2A:
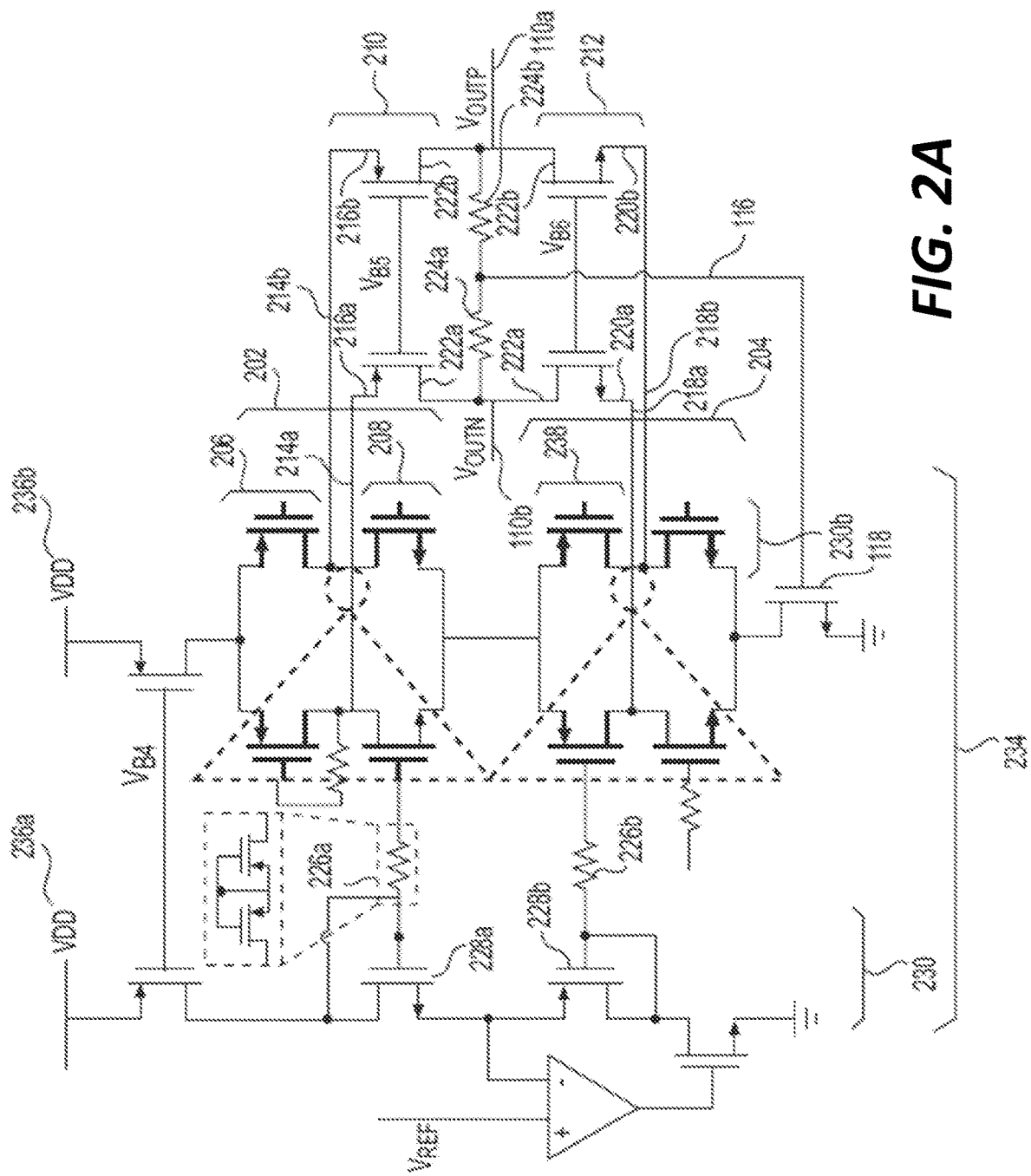
FIG. 2A is a detailed diagram of the inverter-stack array of FIG. 1 configured as a 2-stack inverter array, in accordance with an illustrative embodiment.

FIG. 2A is a detailed diagram of the inverter-stack array 100 of FIG. 1 configured as a 2-stack inverter array, in accordance with an illustrative embodiment. As shown in FIG. 2A, each of the N stacked inverters is implemented as an array of inverter-based transconductors (e.g., CMOS inverter-based transconductor) comprising a first inverter-based transconductor 202 and a second inverter-based transconductor 204 vertically stacked with respect to each other. As shown in FIG. 2A, each of the inverter-based transconductor (e.g., 202, 204) includes a P-MOS transistor pair 206 and an N-MOS transistor pair 208.

The array of inverter-based transconductors (e.g., 202, 204) are coupled to the N-to-1 current summation stage summing circuit (also referred to as a summing circuit) in which each inverter-based transconductor (e.g., 202, 204) is coupled to common-gate (CG) transistors configured to sum up the current outputs of the array of inverter-based transconductors. As shown in FIG. 2A, the outputs 214a, 214b of the first inverter-based transconductor 202 are coupled to sources 216a, 216b of a P-channel MOSET pair 210, and the outputs 218a, 218b of the second inverter-based transconductor 204 are coupled to sources 220a, 220b of an N-channel MOSET pair 212. The gate of each of the MOSFET pairs (210, 212) are coupled to one another to collectively form the common-gate transistors. The drains 222a, 222b of each of the MOSETs pair 210, 212 are respectively coupled to the outputs 110a, 110b of the inverter-stack array 100 to provide the summed outputs of the inverter-based transconductors.

Resistive elements 224a, 224b are coupled to the outputs of the common-gate transistors so as to provide resistive averaging to sense the output common-mode voltage, which is then used to control the tail current source 118 (shown as a P-Channel MOSFET) for common-mode feedback.

Referring still to FIG. 2A, pseudo-resistor elements (shown as 226a, 226c) are used to apply bias voltages of input transistors 228a, 228b. As shown in FIG. 2A, the pseudo-resistor elements (e.g., 226a, 226b) are transistors such as MOS-bipolar devices and, in some embodiments, are configured to minimize the requirements on VDD and to ensure that each input pairs operates in sub-threshold regions (e.g., to maximize $g_m$/ID). When a pseudo-resistor element is activated, it acts as a diode-connected BJT.

Referring still to FIG. 2A, the gate-source of the NMOS transistor pair 208 of the first inverter-based transconductor 202 (as the top stacked inverter) is tightly coupled with the gate-source of the PMOS transistor pair 238 of the second inverter-based transconductor 204 (as the lower stacked inverter) so as to form a replica bias circuit. In some embodiments, the replica bias circuit ensures robustness against process, voltage, and temperature (PVT) variations.

To facilitate low current use operation, the inverter-stack array 100 is configured with a single main bias branch 230 (as shown comprising the transistors 228a, 228b) to provide bias voltages to the second common-source stage (as shown comprising the first inverter-based transconductor 202 and second inverter-based transconductor 204) through resistive voltage dividers formed by the main bias branch 230. The output currents (e.g., via 214a, 214b, 218a, and 218b) from the input stages 234 (as shown comprising main bias branch 230, the first inverter-based transconductor 202 and second inverter-based transconductor 204) are summed up by common-gate transistors 210, 212. It is observed that the inverter-stack array 100 has N output branches—as shown in FIG. 2A with the first inverter-based transconductor 202 and second inverter-based transconductor 204 for a 2-stack inverter—to combine with the N-to-1 current summation stage summing circuit. Notably, the N output branches has a linear relationship to the N-to-1 current summation stage summing circuit. This linear relationship also facilitates more efficient operations that provides for a low NEF. It is observed that a three-stage stacked inverter can be configured to operate with a NEF of 1.07.

In FIGS. 1 and 2A, the exemplified circuit is configured to boost the overall amplifier $g_m$ without increasing the bias current by 1) having the single main bias branch 230 bias the input pairs 202, 204 in subthreshold region to maximize efficiency $g_m/ID$ (gain $g_m$/drain current), and 2) having an inverter input stage (e.g., 202, 204) configured to reuse the bias current twice (through the split N-path capacitive feedback shown in FIG. 1). Notably, and as shown in FIG. 2A, a single low-voltage power supply ("VDD" 236a, 236b) supplies the single main bias branch 230 and the inverter-based transconductors 202, 204 to facilitate low power operation.

Figure 2B:
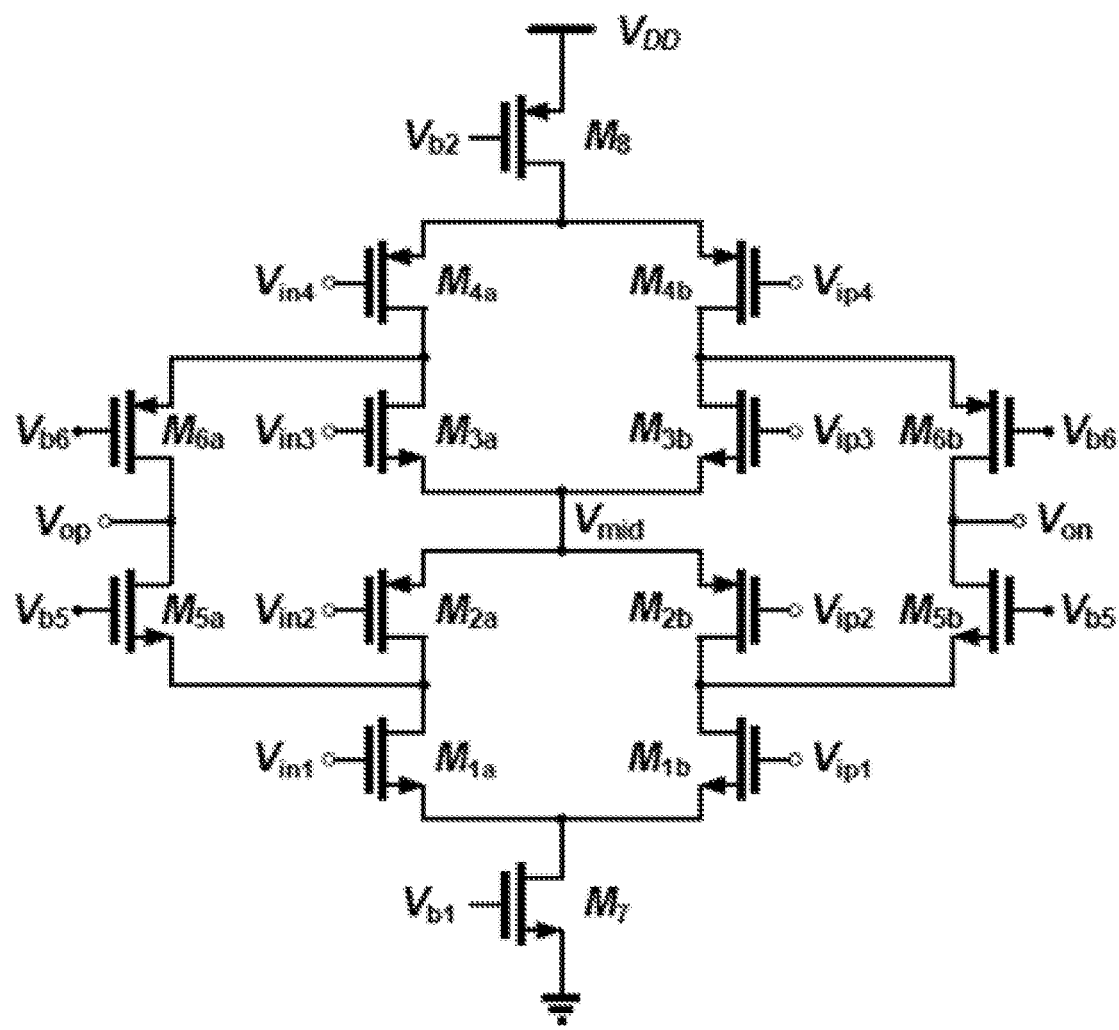
FIG. 2B is another diagram of the N-stack inverter-stack array of FIG. 2A, in accordance with an illustrative embodiment.
Figure 3B:
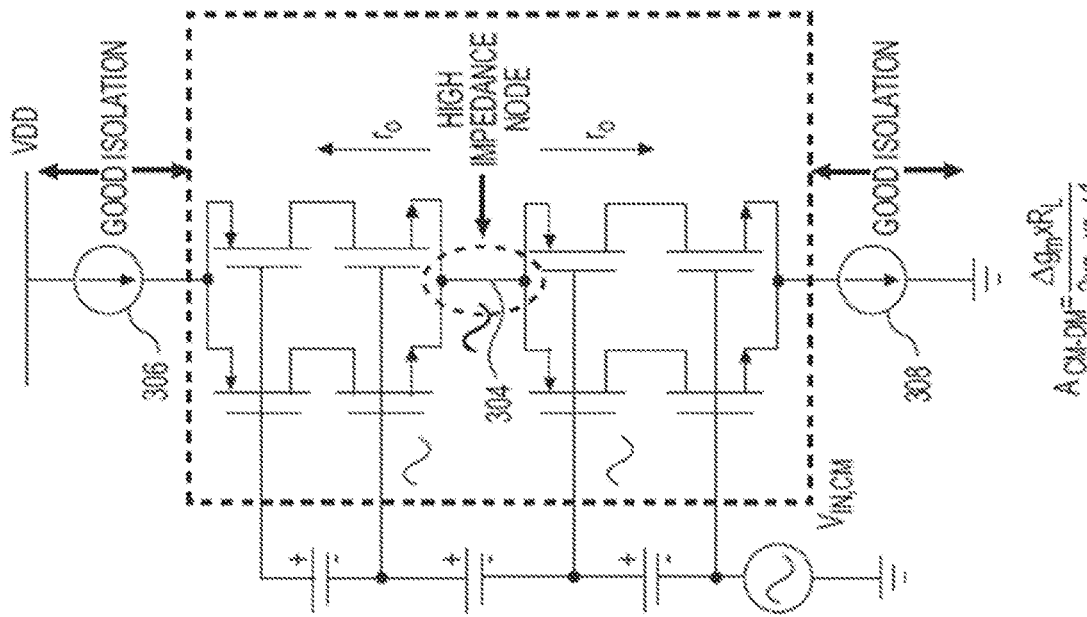
FIGS. 3A and 3B show an equivalent circuit of the input stage for the inverter-stack array of FIGS. 2A and 2B, in accordance with an illustrative embodiment.
Figure 3A:
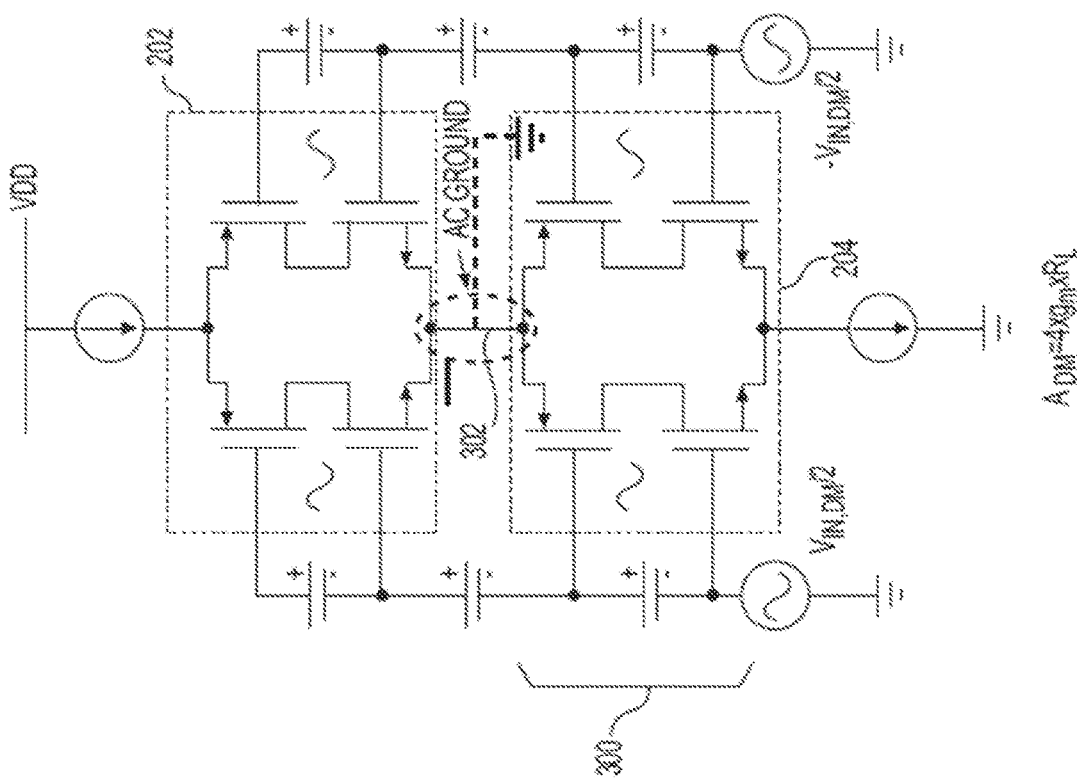

FIG. 2B is another diagram of the N-stack inverter-stack array of FIG. 2A, in accordance with an illustrative embodiment. As shown in FIG. 2B, the 4-input pairs are separated. As shown in FIGS. 3A and 3B, the input signal is AC coupled to all 4 input nodes. In this manner, the input pairs can be biased at different voltage levels. There are no current source transistors placed between the stacked inverters, allowing for lower minimally required power supply voltage of $6V_{ov}$. As further shown in FIG. 2B, 4 common-gate transistors (e.g., $M_{5a}$, $M_{5b}$, $M_{6a}$, and $M_{6b}$) are provided to aggregate the small-signal currents from all input pairs.

Small-Signal Gain, Input-Referred Noise, Offset, CMRR, and PSRR Analyses

The small-signal behavior of the exemplified amplifier of FIGS. 1, 2A, and 2B can analyzed by first deriving that the total amplifier transconductance $g_{mt}$ is by provided below in Equation 1.

$$g_{mt} = \frac{g_m}{I_D} \cdot (2I_D + 2I_D \cdot 0.9) \approx 4g_m \quad \text{(Equation 1)}$$

where $I_D$ is the bias current for the input transistor. In deriving (Equation 1), all input transistors are assumed to have similar $g_m/I_D$ and the intrinsic gain $(g_m r_o)$ for all transistors is much greater than 1. The same assumption can be made for all later derivations. For $M_2$ and $M_3$, the currents are assumed to be 90% of the amplifier bias current, and the remaining 10% current is assumed to flow through the cascade transistors ($M_5$ and $M_6$). In differential mode (DM) operation, the node $V_{mid}$ serves as the virtual ground, and thus the amplifier output impedance rot is given by provided below in Equation 2.

$$r_{ot} = (g_{m5}r_{o5}(r_{o1}//r_{o2}))//(g_{m6}r_{o6}(r_{o3}//r_{o4})) \quad \text{(Equation 2)}$$

where $g_{mi}$ is the transconductance of transistor $M_i$, and $r_{oi}$ is the small-signal output resistance of transistor $M_i$. Thus, the amplifier open-loop DM gain $A_{DM}$ can be derived as provided below in Equation 3.

$$A_{DM} = g_{mt} r_{ot} \approx g_m^2 r_o^2 \quad \text{(Equation 3)}$$

Indeed, it is observed that DM gain can be expressed as the square of the transistor intrinsic gain, which is comparable to that of a telescopic or folded cascode amplifier. Further, the exemplified amplifier can be viewed as a hybridization of a telescopic amplifier and a folded cascode amplifier. For example, if only the lower NMOS input pair (e.g., $M_{1a}$ and $M_{1b}$) is considered, and it is assumed all other input pairs are connected to DC biases, then its overall structure behaves the same as a telescopic amplifier. By contrast, if only the lower PMOS input pair (e.g., $M_{2a}$ and $M_{2b}$) is considered, its input and output relationship is identical to that of a folded cascode amplifier.

The same analogy can be applied for the upper NMOS and PMOS pairs (e.g., $M_{3a}$, $M_{3b}$, $M_{4a}$, and $M_{4b}$). Assuming the input transistors dominate the overall amplifier noise, the overall input referred thermal noise can be derived as provided below in Equation 4.

$$N_{PSD,th} = \frac{8kT\gamma \cdot (g_{m1} + g_{m2} + g_{m3} + g_{m4})}{(g_{m1} + g_{m2} + g_{m3} + g_{m4})^2} \approx \frac{2kT\gamma}{g_m} \quad \text{(Equation 4)}$$

Comparing to Equation 1, it can be observed that the noise PSD is reduced by 4 times due to $g_m$ increase. The input referred 1/f noise PSD of the exemplified amplifier can be derived as provided below in Equation 5.

$$N_{PSD,1/f} = \frac{K_f}{C_{ox} \cdot 4WL} \cdot \frac{1}{f} \quad \text{(Equation 5)}$$

where $K_f$ is a process-dependent parameter, W and L are the transistor width and length, respectively. In the exemplified amplifier, the 1/f noise can be suppressed by increasing the input transistor size, so that the in-band noise is dominated by the thermal noise. The overall input referred offset $V_{os,in}$ can be derived as provided below in Equation 6.

$$V_{os,in} = \frac{\sum_{i=1}^{4} g_{mi} V_{osi}}{g_{m1} + g_{m2} + g_{m3} + g_{m4}} \approx \frac{\sum_{i=1}^{4} V_{osi}}{4} \quad \text{(Equation 6)}$$

Assuming the offset voltages $V_{osi}$ all have the same, or similar, distribution with the standard deviation of $\sigma_{os}$, then the overall input referred offset standard deviation $\sigma_{os,in}$ can be derived as provided below in Equation 7.

$$\sigma_{os,in} = \frac{\sigma_{os}}{2} \quad \text{(Equation 7)}$$

This reduction in the input referred offset may result from the increased total input transistor size. For CMRR calculation, a common-mode (CM) input can be applied and the DM output can be derived in the presence of mismatch, as shown in FIG. 3B. The CMRR can be calculated as provided below in Equation 8.

$$CMRR \equiv \frac{A_{DM}}{A_{CM-DM}} \approx \frac{2g_m r_o}{\frac{\Delta V_{th}}{nkT/q}} \quad \text{(Equation 8)}$$

where $A_{CM-DM}$ denotes the CM-to-DM gain. To simplify Equation 8, all transistors are assumed to have the same, or similar, $g_m$ and $r_o$, and the threshold voltage mismatch $\Delta V_{th}$ between different input pairs are assumed has the same, or similar, distribution. The result of Equation 8 is comparable to that of a telescopic amplifier, which suggests that the exemplified stacking inverters in not having current source isolation do not degrade CMRR. This result may seem counter intuitive. The node $V_{mid}$ is a low-impedance node with all source connections, would should lead to large CM voltage gains for the upper NMOS (e.g., $M_{3a}$ and $M_{3b}$) and lower PMOS (e.g., $M_{2a}$ and $M_{2b}$) input pairs. However, further examination of $V_{mid}$ shows that it tracks the input CM voltage variation. Thus, from a CM analysis point of view, $V_{mid}$ is effectively AC shorted with the CM input, thus, creating a large output resistance from the perspective of looking either up or looking down at $V_{mid}$ that degenerates both middle input pairs. Similarly, PSRR can be derived in the same way as CMRR, and the result is given by Equation 9 below.

$$PSRR \equiv \frac{A_{DM}}{A_{V_{DD}-DM}} \approx \frac{2g_m r_o}{\frac{\Delta V_{th}}{nkT/q}} \quad \text{(Equation 9)}$$

where $A_{V_{DD}-DM}$ denotes the voltage gain from $V_{DD}$ to the differential output. This result is also comparable to that of a telescopic amplifier.

Bias Voltage Generation

To minimize the supply voltage requirement, in some embodiments, the DC bias voltages for all 4 input pairs in FIGS. 2A and 2B are different. The lower NMOS (e.g., $M_{1a}$ and $M_{1b}$) and upper PMOS (e.g., $M_{4a}$ and $M_{4b}$) pairs can be biased because small deviations from ideal bias voltage have minimal influence on the overall amplifier operation. Nevertheless, without a middle current source, the bias voltages for the lower PMOS (e.g., $M_{2a}$ and $M_{2b}$) and upper NMOS (e.g., $M_{3a}$ and $M_{3b}$) should be generated with care because their difference can directly set ($|V_{gs2}|+|V_{gs3}|$) and the bias current. In some embodiments, to ensure the PVT robustness, a replica-based bias circuit may be used.

Figure 2C:
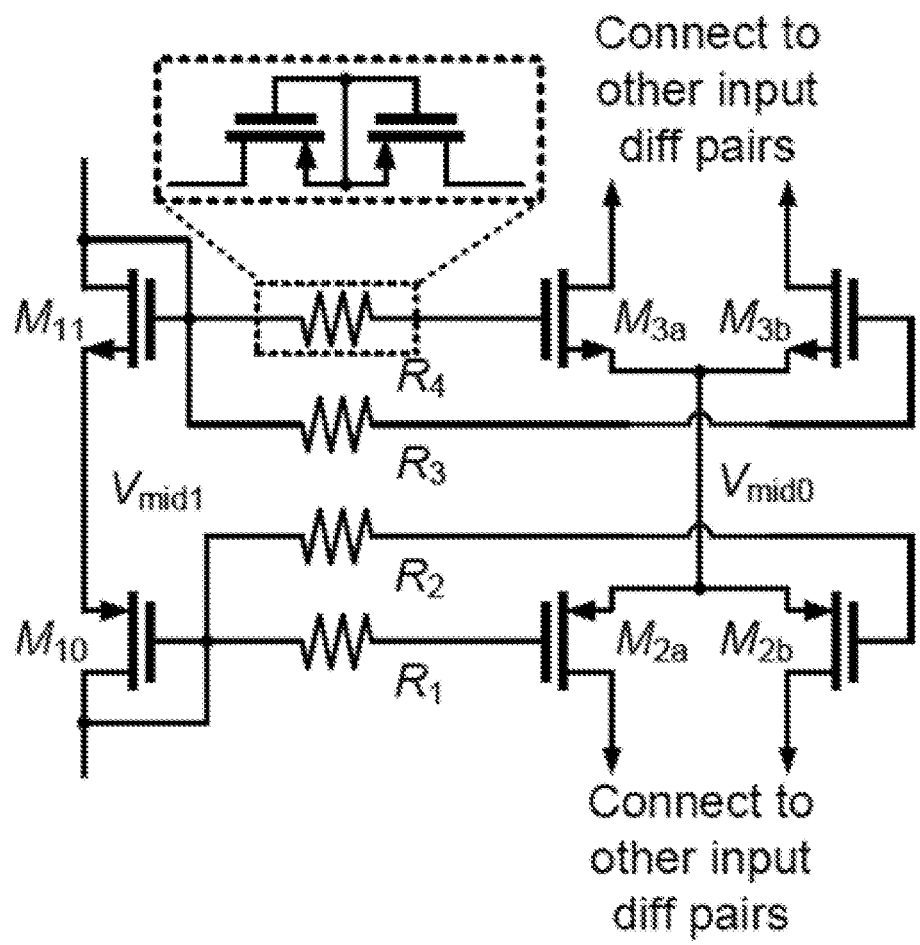
FIG. 2C is a diagram of a replica-based bias circuit of the N-stack inverter-stack array of FIG. 1, in accordance with an illustrative embodiment.
Figure 2D:
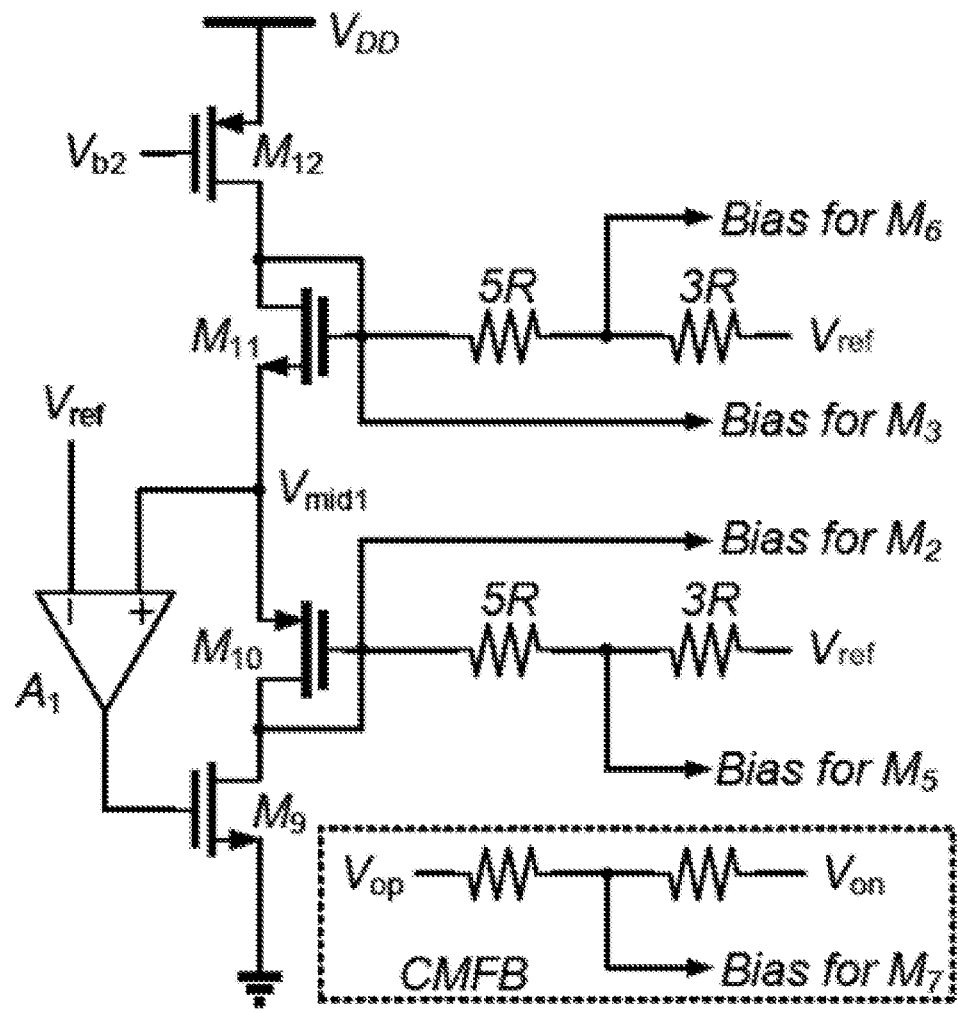
FIG. 2D is a diagram of a bias branch and the CMFB circuit of the N-stack inverter-stack array of FIG. 1, in accordance with an illustrative embodiment.

FIG. 2C is a diagram of a replica-based bias circuit of the N-stack inverter-stack array of FIG. 1, in accordance with an illustrative embodiment. The replica-based bias circuit can be used to ensure that transistors $M_2$ and $M_3$ are all biased at the target current level with the right gate voltages. A negative feedback loop can also be implemented to ensure that $V_{mid}$ stays at the intended voltage $V_{ref}=V_{DD}/2$. The replica-based bias branch and CMFB circuit are given in FIG. 2D. Referring still to FIG. 2C, transistor $M_{10}$ is used to bias the PMOS (e.g., $M_{2a}$ and $M_{2b}$) in the bottom inverter, and transistor $M_{11}$ is used to bias the NMOS (e.g., $M_{3a}$ and $M_{3b}$) on the top inverter. Transistors M5 and M6, in some embodiments, are cascode transistors, which can be used to provide low impedance nodes at the drain side of transistors $M_1$, $M_2$, $M_3$, and $M_4$. Thus, the mismatch-induced current difference between the bias (e.g., at $M_{10}$ and $M_{11}$) and input transistors (e.g., $M_2$ and $M_3$) will flow into the common gate transistors. About 10 percent of the amplifier bias current is allocated to the common gate (cascode) transistors (e.g., $M_{5a}$, $M_{5b}$, $M_{6a}$, and $M_{6b}$). Resistor dividers are used, in some embodiments, to generate voltages to bias the cascode transistors. The bias voltages are copied, in some embodiments, to the main amplifier using pseudo-resistors that can achieve high resistance with a small chip area. Example of pseudo-resistors are provided in R. Harrison and C. Charles., "A Low-Power Low-Noise CMOS Amplifier for Neural Recording Applications," IEEE J. Solid-State Circuits, vol. 38, no. 6, pp. 958-965, June 2003, which is incorporated by referenced herein in its entirety. Common-mode feedback can also be implemented with a pseudo-resistor based voltage averager.

Closed-Loop Configuration with Split Capacitor Feedback

Figure 2E:
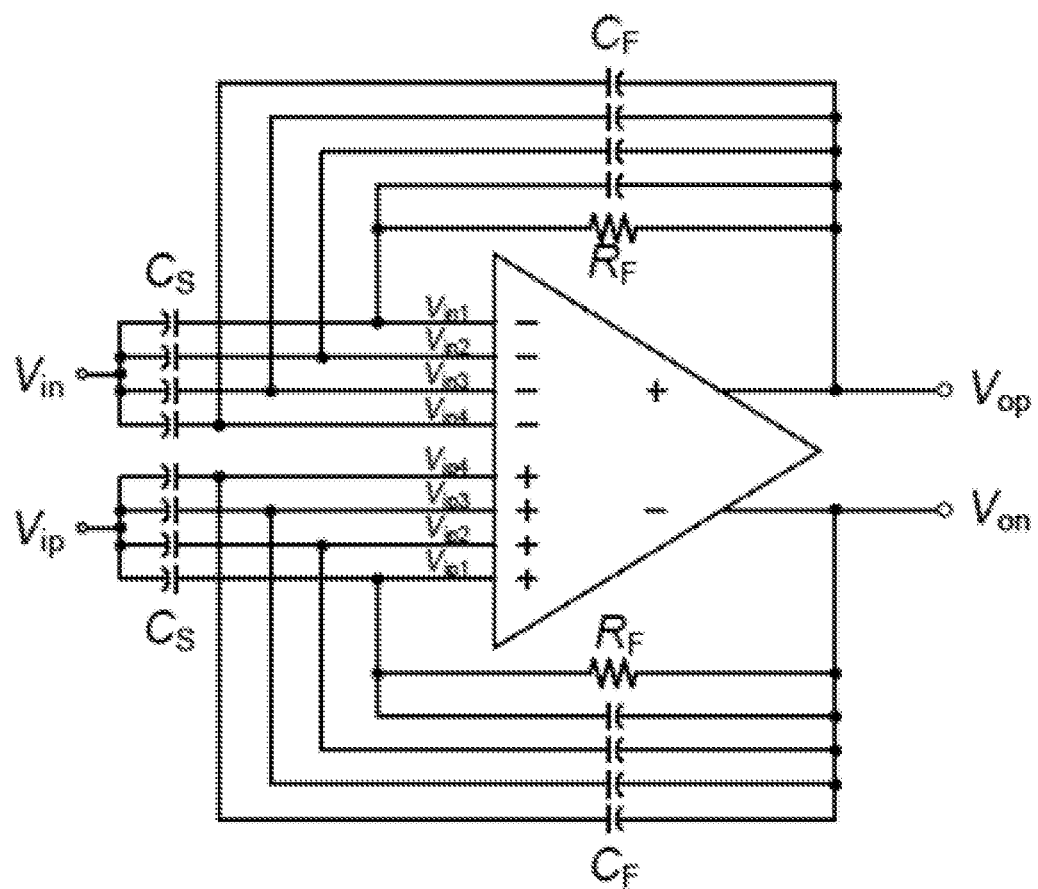
FIG. 2E shows a block diagram of the capacitive-feedback amplifier (e.g., closed-loop amplifier with split capacitor feedback) using the exemplified inverter stacking amplifier of FIGS. 1, 2A, and 2B, in accordance with an illustrative embodiment.

FIG. 2E shows a block diagram of the capacitive-feedback amplifier (e.g., closed-loop amplifier with split capacitor feedback) using the exemplified inverter stacking amplifier of FIGS. 1, 2A, and 2B, in accordance with an illustrative embodiment. The required AC coupling can be realized by splitting the input and feedback capacitors into 4 pieces. Although there are multiple feedback paths, the overall behavior of this amplifier can be made the same as a classic capacitive-feedback amplifier whose closed-loop gain $A_{cl}$ is set by the capacitor ratio per Equation 10.

$$A_{cl} \approx \frac{C_S}{C_F} \quad \text{(Equation 10)}$$

A feedback pseudo-resistor $R_F$ connects the output with the input pair $M_{1a}/M_{1b}$. This DC feedback can greatly reduce the output referred offset, which would saturate the amplifier if not addressed. Note that although this feedback is formed at only one input pair, it addresses the offsets from all input pairs. Using the model of FIG. 2F, the overall output referred offset $V_{os,out}$ can be derived as provided in Equation 11, and its standard deviation $\sigma_{os,out}$ can be derived in Equation 12.

$$V_{os,out} = \frac{\sum_{i=1} g_{mi} V_{osi}}{g_{m1}} \quad \text{(Equation 11)}$$

$$\sigma_{os,out} = 2 \cdot \sigma_{os} \quad \text{(Equation 12)}$$

Comparing with Equation 7, Equation 12 shows that the closed-loop output referred offset $\sigma_{os,out}$ is only four times of the open-loop input referred offset $\sigma_{os,in}$. This indicates that the amplifier output would not be saturated by the offset. To this end, in a multi-input closed-loop amplifier configuration, one path of DC feedback loop is sufficient to prevent the output from saturation. Further, another benefit of the resistor feedback is that it removes the need to generate a separate DC bias for the input pair $M_{1a}/M_{1b}$.

Figure 2F:
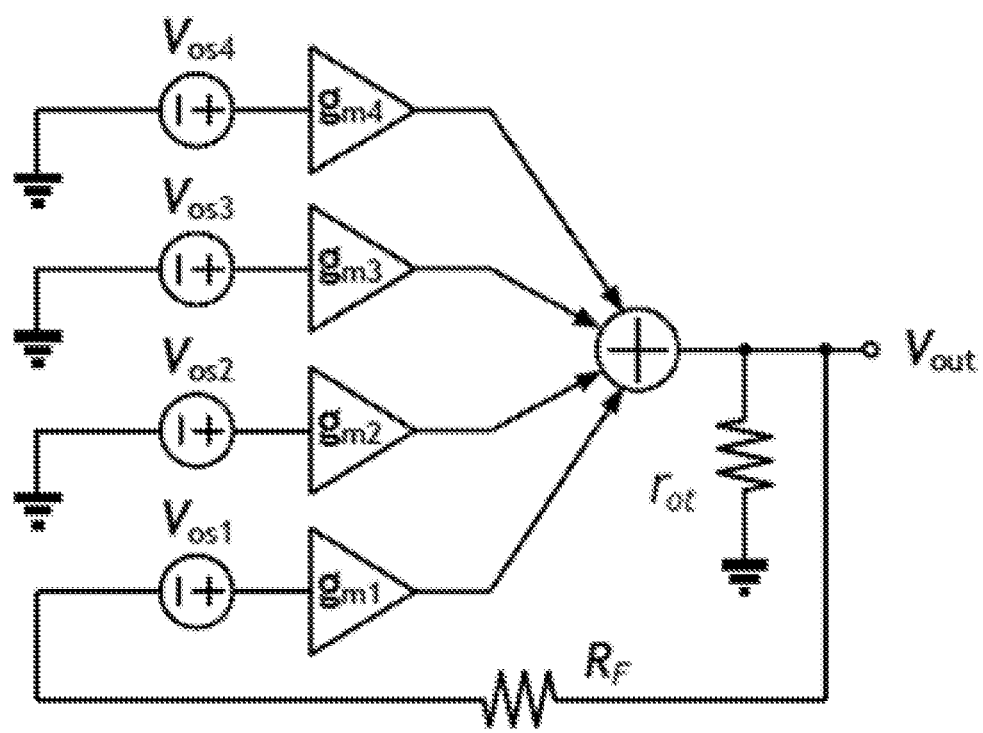
FIG. 2F is a diagram of an offset averaging model of the N-stack inverter-stack array of FIG. 1, in accordance with an illustrative embodiment.
Figure 2G:
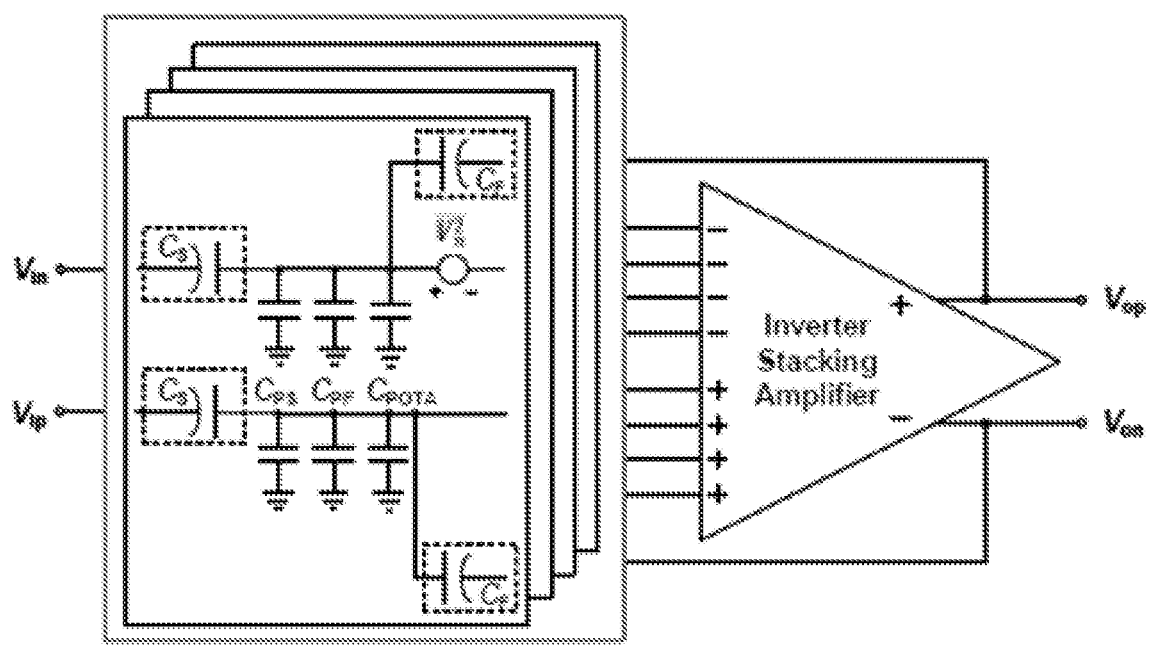
FIG. 2G is a diagram of the exemplary N-stack inverter-stack array of FIG. 1 shown with parasitic capacitors, in accordance with an illustrative embodiment.

FIG. 2F is a diagram of an offset averaging model of the N-stack inverter-stack array of FIG. 1, in accordance with an illustrative embodiment. FIG. 2G may be used to analyze the total noise of the exemplified amplifier, where $C_{PS}$, $C_{PF}$, and $C_{POTA}$ represent the parasitic capacitance of $C_S$, $C_F$, and the OTA input capacitance, respectively. The overall input referred noise PSD of the closed-loop amplifier can be derived per below in Equation 13.

$$N_{PSD} \approx \frac{2kT\gamma}{g_m} \cdot \left(1 + \frac{1}{|A_{cl}|}\right)^2 \left(1 + \frac{C_P}{C_S + C_F}\right)^2 \quad \text{(Equation 13)}$$

where $C_P = C_{PS} + C_{PF} + C_{POTA}$. Comparing Equation 13 and Equation 4, it can be observed that the input referred noise can naturally degrade going from open-loop to closed-loop, which may be a common phenomenon in any closed-loop amplifier. To minimize the degradation, the exemplified amplifier may be configured to enlarge the closed-loop gain $A_{cl}$ and minimize the parasitic capacitance $C_P$. In some embodiments, for a closed-loop amplifier with gain of 20 and 20% parasitic capacitance, the PSD is increased by 50%, leading to an increased in NEF by 23%.

In some embodiments, the output signal swing is reduced. For example, with a 1 V power supply and $|V_{ds}|$ of 100 mV, the output swing is 400 mV. It can be used as a sensor front-end amplifier and other applications that does not require nearly rail-to-rail output swings.

In some embodiments, to increase the output swing, the exemplified amplifier, in some embodiments, is configured with a second-stage amplifier, like a two-stage amplifier that employs a telescopic amplifier followed by a common-source stage. Examples of the two-stage amplifier is described in F. M. Yaul and A. P. Chandrakasan., "A sub-μW 36 nV/√Hz chopper amplifier for sensors using a noise-efficient inverter-based 0.2V-supply input stage," 2016 IEEE International Solid-State Circuits Conference (ISSCC), pp. 94-95 (February 2016), which is incorporated by reference herein in its entirety.

In some embodiments, the exemplified amplifier is implemented with a chopping circuit to modulate an input DC signal to the chopping frequency to provide the input AC coupling. Applying chopping via the chopping circuit can also suppress the 1/f noise. In some embodiments, the 1/f noise is attenuated by sizing up the input transistors.

Input Stage of Inverter Stack Array

FIGS. 3A and 3B show an equivalent circuit of the input stage for the inverter-stack array, in accordance with an illustrative embodiment. For a differential-mode input (FIG. 3A), the connection node 302 between the N stacked inverters (e.g., 202, 204) acts as a virtual ground, and thus, the overall $g_m$ is boosted by 4 times. As shown in FIG. 3A, the effective differential mode gain $A_{DM} = 4 \times g_m \times R_L$ where $R_L$ is the resistive load.

For a common mode input (FIG. 3B), because of the tight coupling between the gate voltages, the connection node 304 has a high impedance although it connects to the transistor source terminal. This property ensures a high CMRR (common mode rejection ratio). To obtain a high PSRR (power-supply rejection ratio), two current sources 306, 308 are placed on top and bottom to isolate the inverter core from both power lines. As shown in FIG. 3B, the effective common-mode gain $$A_{CM-DM} = \frac{\Delta g_m \times R_L}{2 \times g_m \times r_o + 1},$$

where RL is the resistive load, and $r_o$ is the resistance of a given inverter stack.

Noise Analysis of Inverter Stack Array

Figure 4:
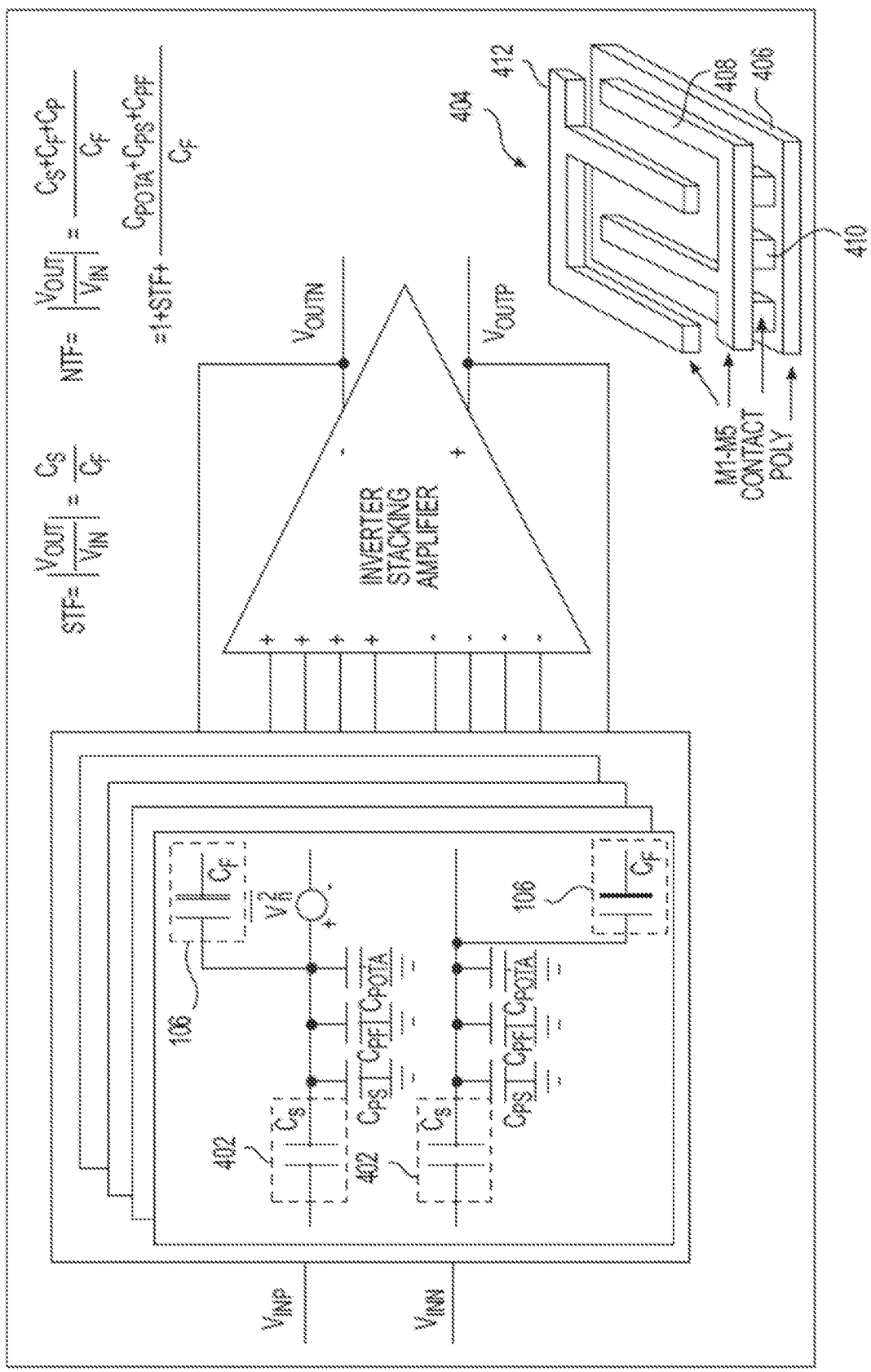
FIG. 4 shows a noise analysis of the inverter stack array in accordance with an illustrative embodiment.

FIG. 4 shows a noise analysis of the inverter stack array in accordance with an illustrative embodiment.

As shown in FIG. 4, the signal transfer function (STF) can be calculated per Equation 14.

$$\left|\frac{V_{out}}{V_{in}}\right| = \frac{C_S}{C_F} \quad \text{(Equation 14)}$$

where $C_S$ is the input capacitance 402 to the inverter stack array, and $C_F$ is a N-path feedback capacitance (as shown 106 here) of the capacitive feedback network (e.g., 106a-106h).

The amplifier noise transfer function (NTF) can be calculated per Equation 15.

$$\left|\frac{V_{out}}{V_{in}}\right| = \frac{C_S + C_F + C_P}{C_F} = 1 + STF + \frac{C_{POTA} + C_{PS} + C_{PF}}{C_F} \quad \text{(Equation 15)}$$

where $C_P$ is a total parasitic capacitance, $C_{POTA}$ is a parasitic capacitance associated with a top plate of the amplifier, $C_{PS}$ is a parasitic capacitance of the input capacitance to the inverter stack array, and $C_{PF}$ is the parasitic capacitance of the capacitive feedback network. As shown, the amplifier noise Vn is inherently amplified more than the input Vin, which illustrates the inevitable NEF degradation in a closed-loop setup comparing to open-loop.

To provide improved noise-efficiency factor (NEF) and to reduce the noise-transfer function (NTF), the parasitic capacitance at the input nodes is minimized (and shown modeled as $C_{PS}$, $C_{PF}$, and $C_{POTA}$). To this end, a semi-sandwich layout (shown as 404) is implemented to reduce the top plate capacitance of CS and CF. According to simulation, this technique reduces the total parasitic capacitance by 50% and improves the NEF by 17% as compared to conventional techniques. According to the NTF, a lower $C_p$ will yield a lower NEF.

As shown in the semi-sandwich layout 404, a poly layer 406 is used as a shielding layer. The poly layer 406 is connected with one of the plates (shown as 408) through contacts 410 to provide a reduced parasitic capacitor structure between the other plate 412 and ground.

Experimental Results

Results for 2 prototypes—a 2-stack inverter array and a 3-stack inverter array implemented in 180 nm CMOS are provided.

Figure 5A:
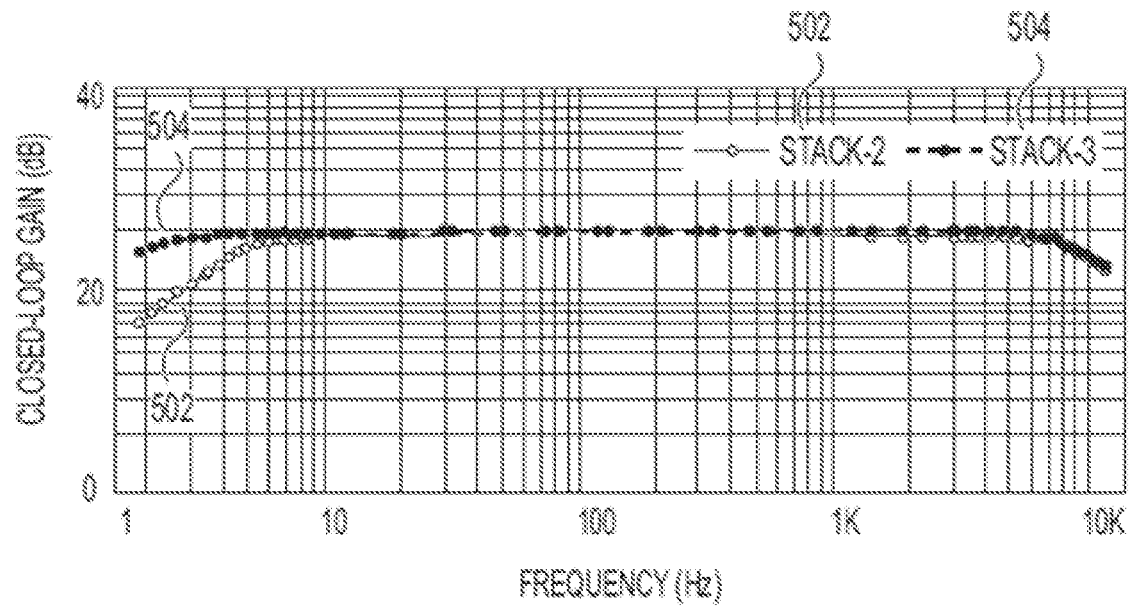
FIG. 5A shows a measured amplifier frequency response for a 2-stacked inverter array and a 3-stacked inverter array, in accordance with an illustrative embodiment.
Figure 5B:
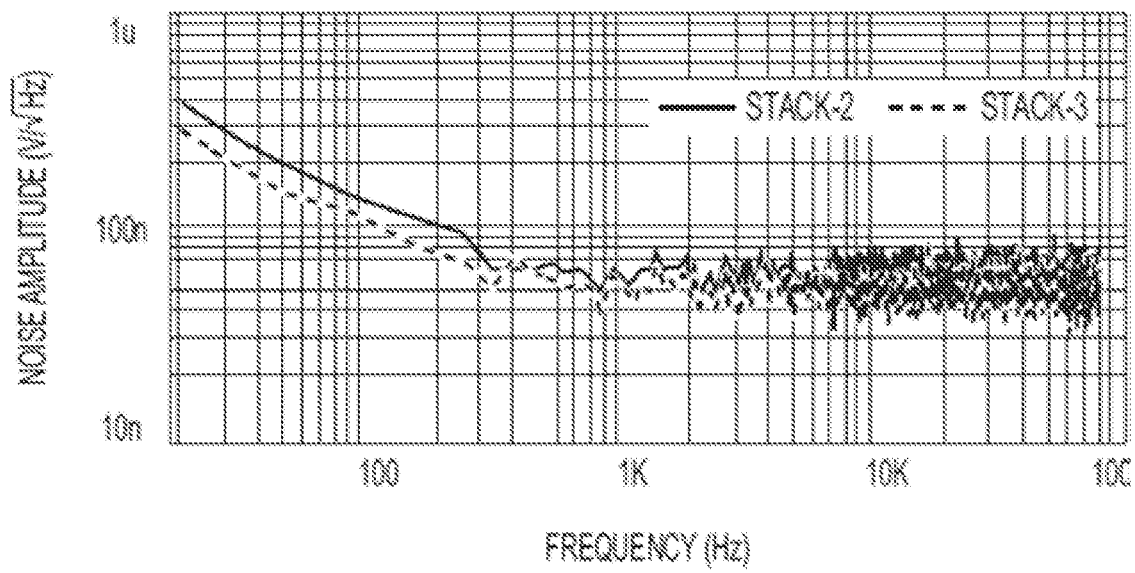
FIG. 5B shows a measured input referred noise (IRN) power-spectral density (PSD) of the 2-stacked inverter stack array and another of the 3-stacked inverter stack array, in accordance with an illustrative embodiment.

FIG. 5A shows a measured amplifier frequency response (in dB) for a 2-stack inverter array 502 and a 3-stack inverter array 504, in accordance with an illustrative embodiment. As shown in FIG. 5A, the measured amplifier frequency response matches the target application of action potential recording whose signal BW is from 250 Hz to 10 kHz. FIG. 5B shows a measured input referred noise (IRN) power-spectral density (PSD) of the 2-stack inverter stack array and another of the 3-stack inverter stack array, in accordance with an illustrative embodiment.

The measured total in-band rms IRN are about 6.7 uV and about 5.5 uV for the stack-2 and the stack-3 inverter array, respectively. The measured NEF for stack-2/3 are about 1.24 and about 1.07, respectively. The flat-band gains are about 25.4 and about 25.6 dB, respectively over the frequency range of about 4 Hz to about 10 kHz.

Figure 7:
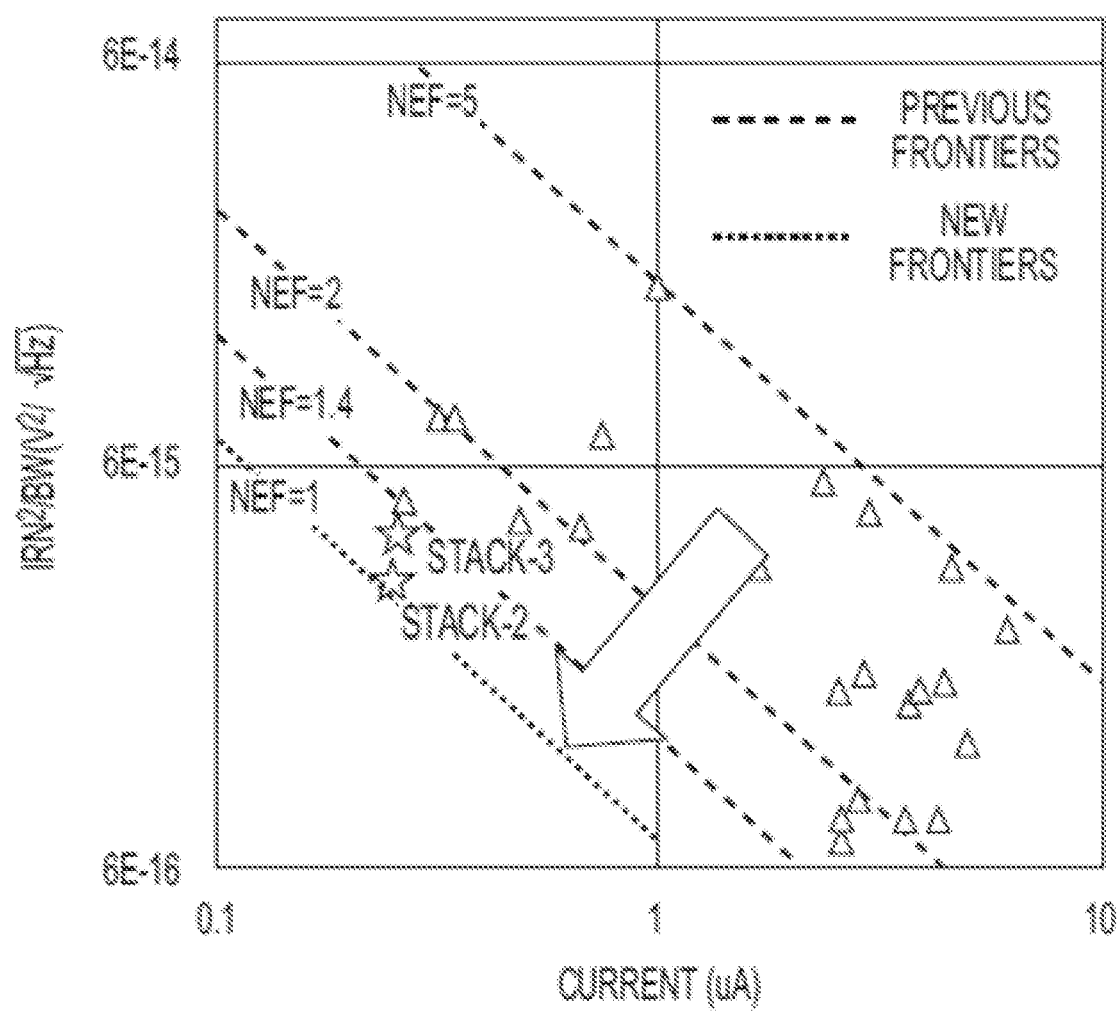
FIG. 7 shows a plot of noise-efficiency factor performance of the 2-stack inverter stack array and another of the 3-stack inverter stack array, in accordance with an illustrative embodiment.

Table I summarizes the performance of the prototype amplifiers. To emphasize the power efficiency of the proposed amplifier, FIG. 7 plots the reported measured NEF results of latest amplifiers. The dotted lines indicate the equivalent NEF value. It can be seen that the exemplified amplifiers establish a new tradeoff between the noise and power, and pushes the NEF boundary to a new level. As shown in Table I, the 3-stack inverter stack array remarkably achieves a NEF of about 1.07, and the 2-stack inverter stack array achieves a NEF of about 1.24.

TABLE I

|  | Stack-2 | Stack-3 |
|---|---|---|
| Closed-loop | | Y |
| Process | | 0.18 μm |
| Area(mm$^2$) | 0.01 | 0.02 |
| Gain(dB) | 25.4 | 25.6 |
| CMRR(dB) | 82 | 84 |
| PSRR(dB) | 81 | 76 |
| VDD(V) | 0.9 | 1.0 |
| Power(μW) | 0.23 | 0.25 |
| Bandwidth(Hz) | 10k | 10k |
| IRN (μV$_{rms}$) | 6.7 | 5.5 |
| NEF | 1.24 | 1.07 |
| PEF | 1.33 | 1.14 |

FIG. 5B plots the measured input referred noise. The 1/f noise corner is about 300 Hz. The total integrated rms input referred noise over the signal bandwidth (250 Hz to 10 kHz) is about 6.7 μV and about 5.6 μV, respectively. These results translate to the NEF of about 1.24 and about 1.07 for the stack-2 and stack-3 inverter amplifiers, respectively. The measured closed-loop CMRR and PSRR are about 82 dB and about 81 dB for the stack-2 inverter amplifier, and about 84 dB and about 76 dB for the stack-3 inverter amplifier.

Figure 5C:
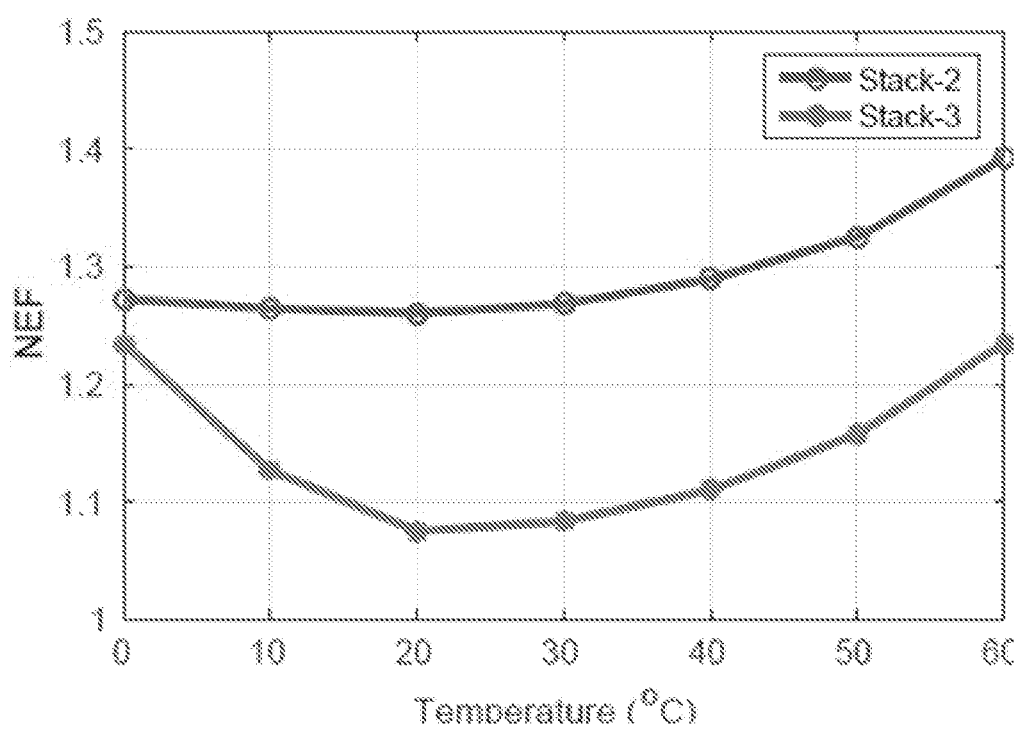
FIG. 5C shows a measured NEF performance versus temperature of the 2-stacked inverter stack array and the 3-stacked inverter stack array, in accordance with an illustrative embodiment.

FIG. 5C shows the measured NEF over the temperature range from about 0° C. to about 60° C. for both stack-2 and stack-3 prototypes. The NEF variations are within about 15%.

Figure 6A:
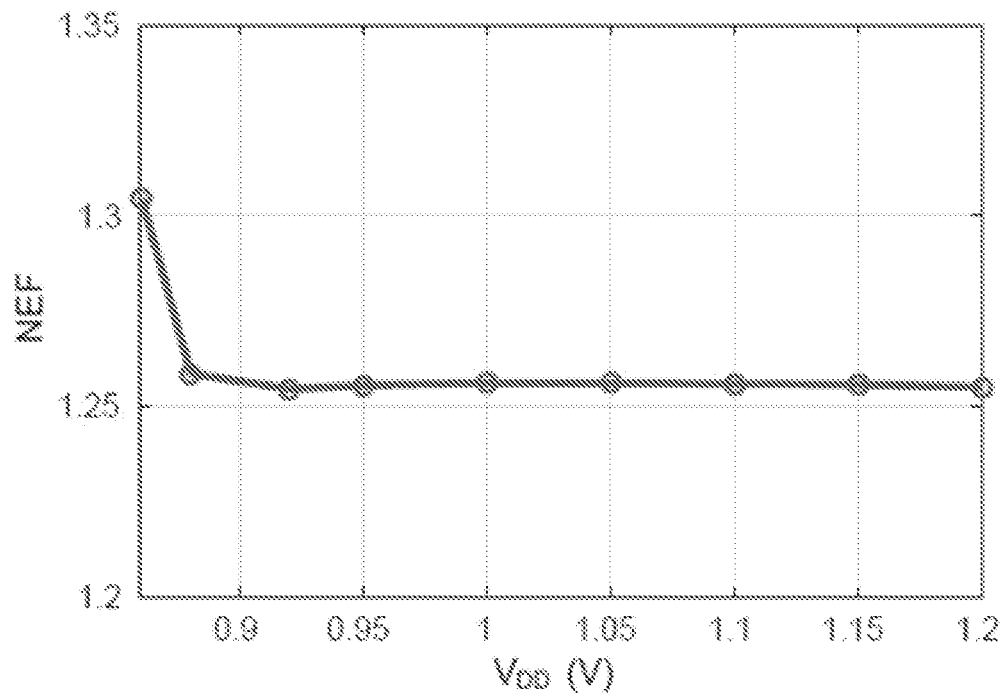
FIG. 6A shows a measured NEF performance versus power supply of the 2-stacked inverter stack array, in accordance with an illustrative embodiment.
Figure 6B:
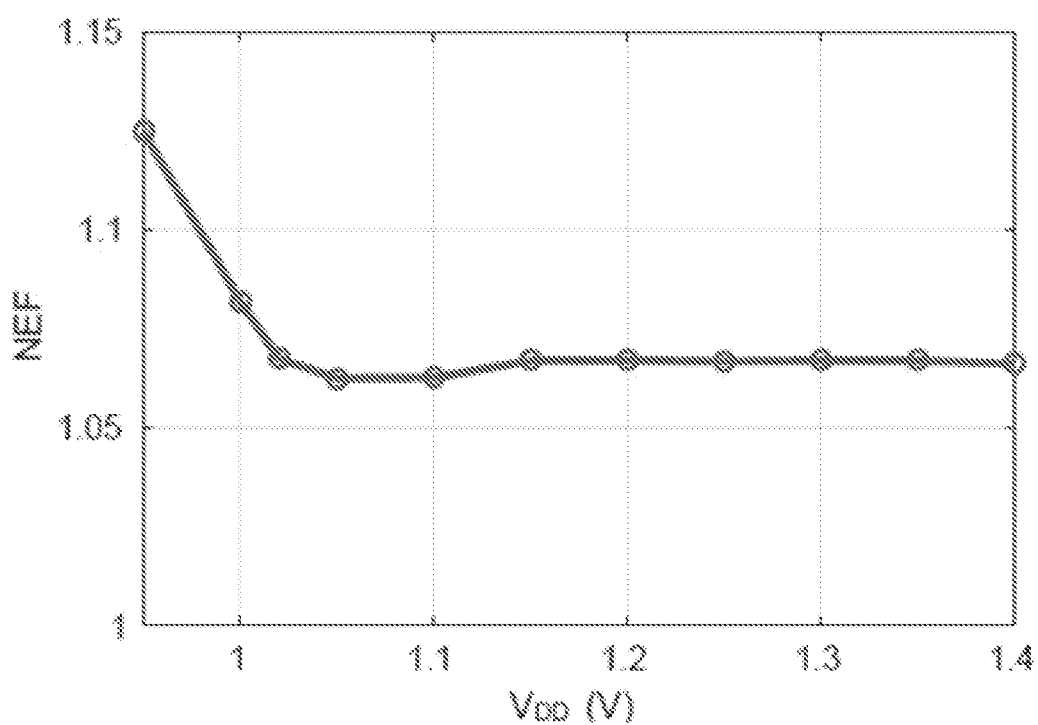
FIG. 6B shows a measured NEF performance versus power supply of the 3-stacked inverter stack array, in accordance with an illustrative embodiment.

FIGS. 6A and 6B show the measured NEF at different supply voltages for stack-2 and stack-3 versions, respectively. Both achieve consistent NEF results. For the prototyped stack-2 inverter amplifier, the measured NEF maintains at about 1.26 for supply voltage beyond 0.9 V; while for the stack-3 prototype, the NEF is maintained at about 1.07 for supply voltage beyond 1 V.

As noted above, FIG. 7 shows a plot of noise-efficiency factor performance of the 2-stack inverter stack array and another of the 3-stack inverter stack array, in accordance with an illustrative embodiment. Notably, FIG. 7 shows NEF performance of the 2-stack inverter stack array and another of the 3-stack inverter stack array in reaching new level of performance as compared to those reported in the technical literature. Performance of other devices from the technical literature are also presented—examples are shown from Muller, Rikky, et al. "A minimally invasive 64-channel wireless μECoG implant," IEEE Journal of Solid-State Circuits Vol. 50.1, pp. 344-359 (2015); Harrison, Reid R. et al. "A low-power low-noise CMOS amplifier for neural recording applications," IEEE Journal of solid-state circuits Vol. 38.6, pp. 958-965 (2003); Song, Shuang, et al. "A low-voltage chopper-stabilized amplifier for fetal ECG monitoring with a 1.41 power efficiency factor," IEEE transactions on biomedical circuits and systems Vol. 9.2, pp. 237-247 (2015); Johnson, Ben et al. "An orthogonal current-reuse amplifier for multi-channel sensing," IEEE Journal of Solid-State Circuits, Vol. 48.6, pp. 1487-1496 (2013); Chen, Yen-Po et al. "A 266 nW multi-chopper amplifier with 1.38 noise efficiency factor for neural signal recording," VLSI Circuits Digest of Technical Papers, 2014 Symposium on. IEEE, 2014; and Yaul, Frank M. et al. "A sub-μW 36 nV/√Hz chopper amplifier for sensors using a noise-efficient inverter-based 0.2 V-supply input stage," Solid-State Circuits Conference (ISSCC), 2016 IEEE International. IEEE, 2016, each of which is incorporated by reference herein in its entirety.

Circuit Implementation

Figure 8:
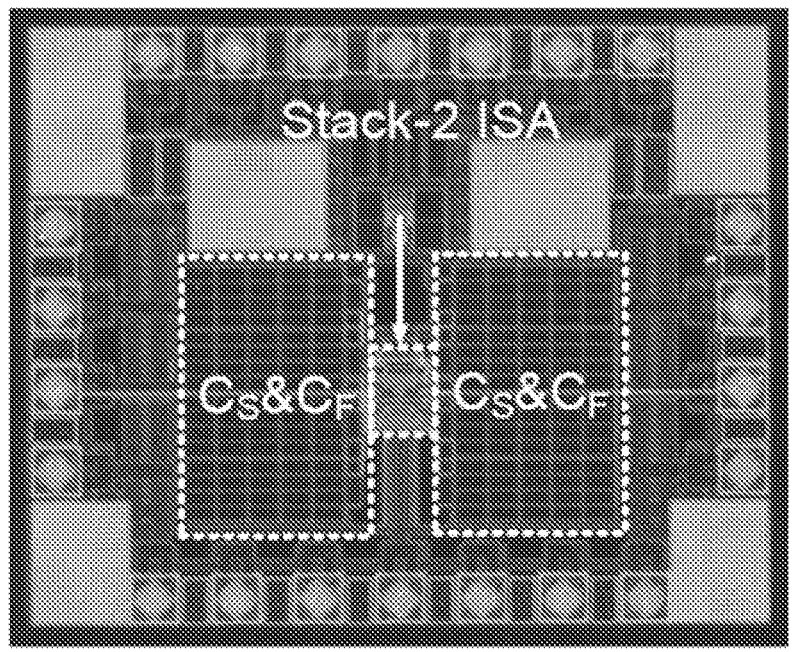
FIGS. 8 and 9 show photos of prototyped 180-nm CMOS integrated circuits for the 2-stack inverter stack array and the 3-stack inverter stack array, in accordance with an illustrative embodiment.
Figure 9:
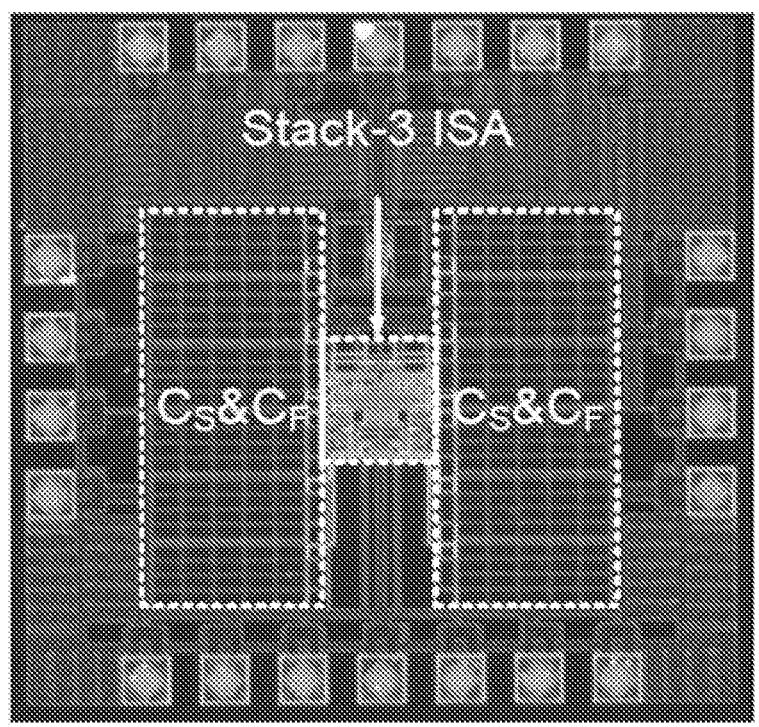

FIGS. 8 and 9 show photos of 180 nm CMOS integrated circuits—one of the 2-stack inverter stack array and another of the 3-stack inverter stack array, in accordance with an illustrative embodiment. The amplifier core areas for stack-2 and stack-3 versions are about 0.01 mm$^2$ and about 0.02 mm$^2$, respectively. The total closed-loop amplifier areas for stack-2 and stack-3 versions are about 0.22 mm$^2$ and about 0.29 mm$^2$, respectively, mainly dominated by capacitors. The supply voltage for the stack-2 and stack-3 versions are about 0.9 and about 1.0 V, respectively. The measured power consumptions are about 226 nW and about 246 nW, respectively.

Figure 10A:
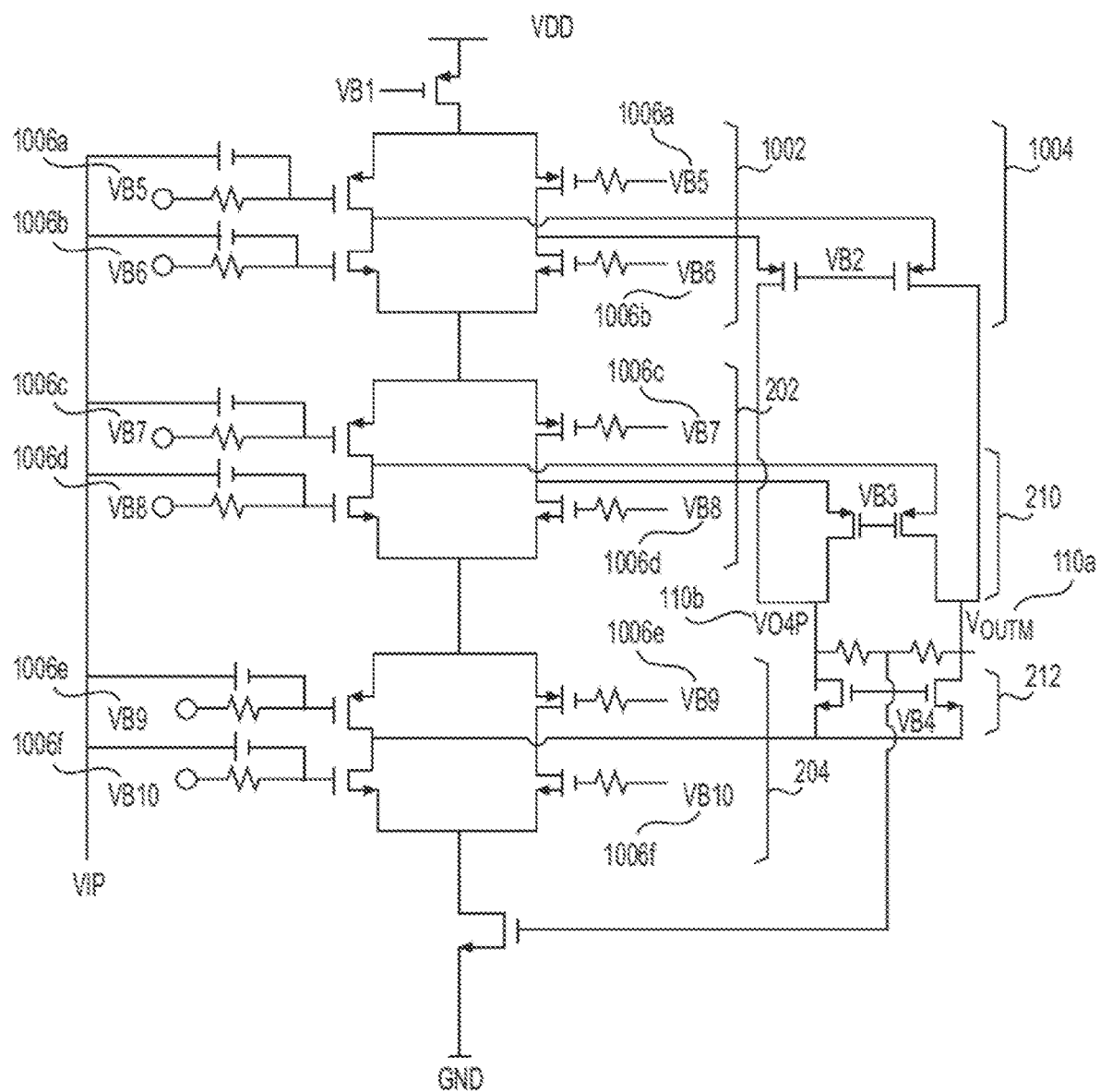
FIG. 10A is a diagram of an N-stack inverter-stack array of FIG. 1 configured as a 3-stacked inverter stack array, in accordance with an illustrative embodiment.
Figure 10B:
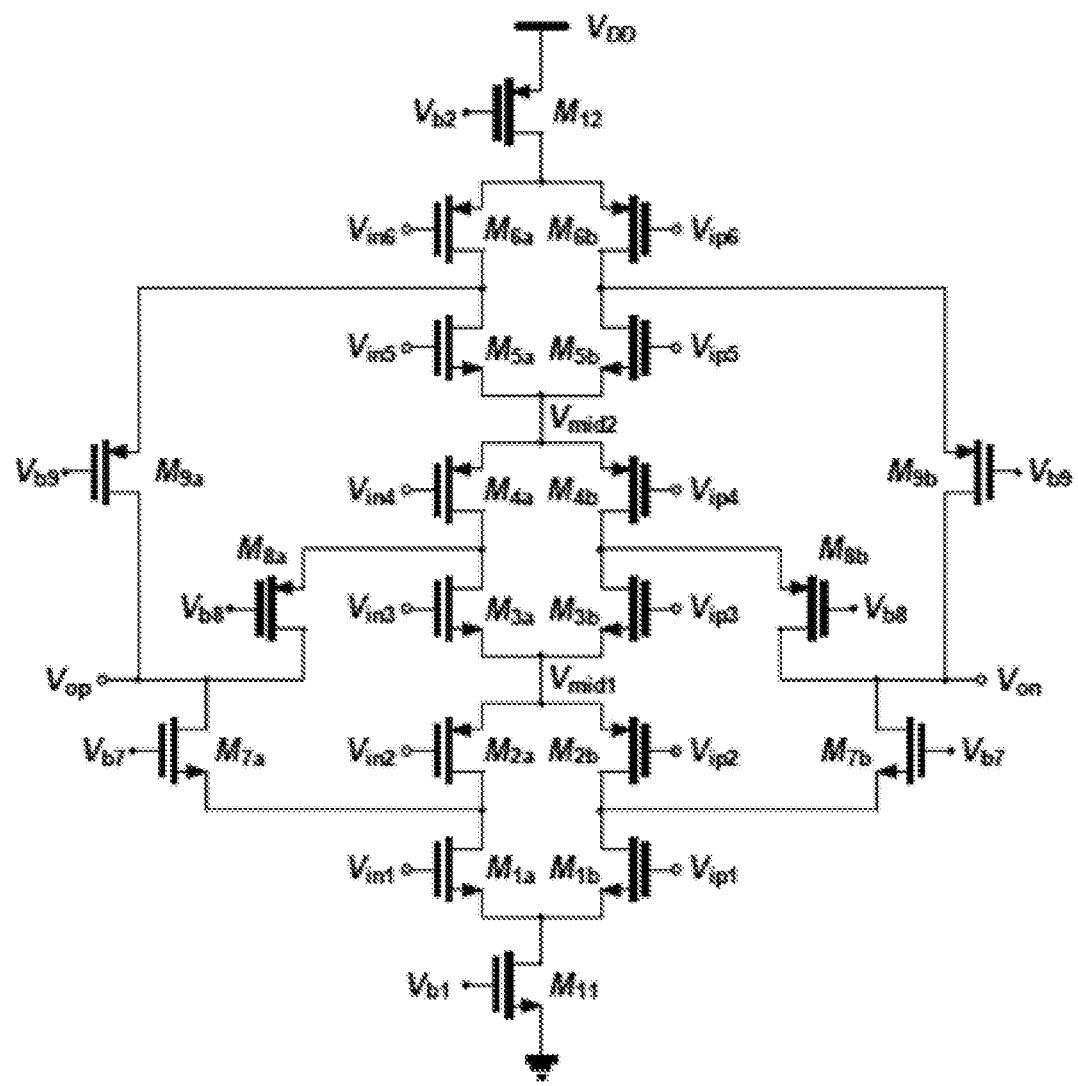
FIG. 10B is another diagram of the 3-stacked inverter stack array of FIG. 10A, in accordance with an illustrative embodiment.

Both the exemplified stack-2 and stack-3 amplifiers of FIGS. 2B and 10B have been implemented in 180 nm CMOS process. The intended application is action potential recording with the signal bandwidth from 250 Hz to 10 kHz and the signal amplitude up to 1 mV. The dimension of the transistors in the amplifier cores are summarized in Table II and Table III. Large transistor widths and lengths are chosen to boost the transistor intrinsic gain, reduce the offset, as well as suppress the 1/f noise corner to be below 250 Hz. All transistors operate in subthreshold region to boost the current efficiency gm=ID. The current of the amplifier core is 220 nA. The common-gate transistors used for current summation are biased at 20 nA. The output common-mode is set to VDD/2 using the classic resistor-averaging common-mode feedback circuit.

TABLE II

Example Geometry of Stack-2 Inverter Amplifier

| Device | W/L(μm) |
|---|---|
| $M_{1a}/M_{1b}$ | 23/5 |
| $M_{2a}/M_{2b}$ | 11/4 |
| $M_{3a}/M_{3b}$ | 40/4 |
| $M_{4a}/M_{4b}$ | 10/4 |
| $M_{5a}/M_{5b}$ | 1.9/4 |
| $M_{6a}/M_{6b}$ | 0.6/4 |
| $M_7$ | 14/4 |
| $M_8$ | 10/4 |

TABLE III

Example Geometry of Stack-3 Inverter Amplifier

| Device | W/L(μm) |
|---|---|
| $M_{1a}/M_{1b}$ | 12/5 |
| $M_{2a}/M_{2b}$ | 12/4 |
| $M_{3a}/M_{3b}$ | 36/4 |
| $M_{4a}/M_{4b}$ | 11/4 |
| $M_{5a}/M_{5b}$ | 50/4 |
| $M_{6a}/M_{6b}$ | 10/4 |
| $M_{7a}/M_{7b}$ | 6/0.8 |
| $M_{8a}/M_{8b}$ | 1/4 |
| $M_{9a}/M_{9b}$ | 2/4 |
| $M_{10a}/M_{105b}$ | 1/4 |

Figure 11:
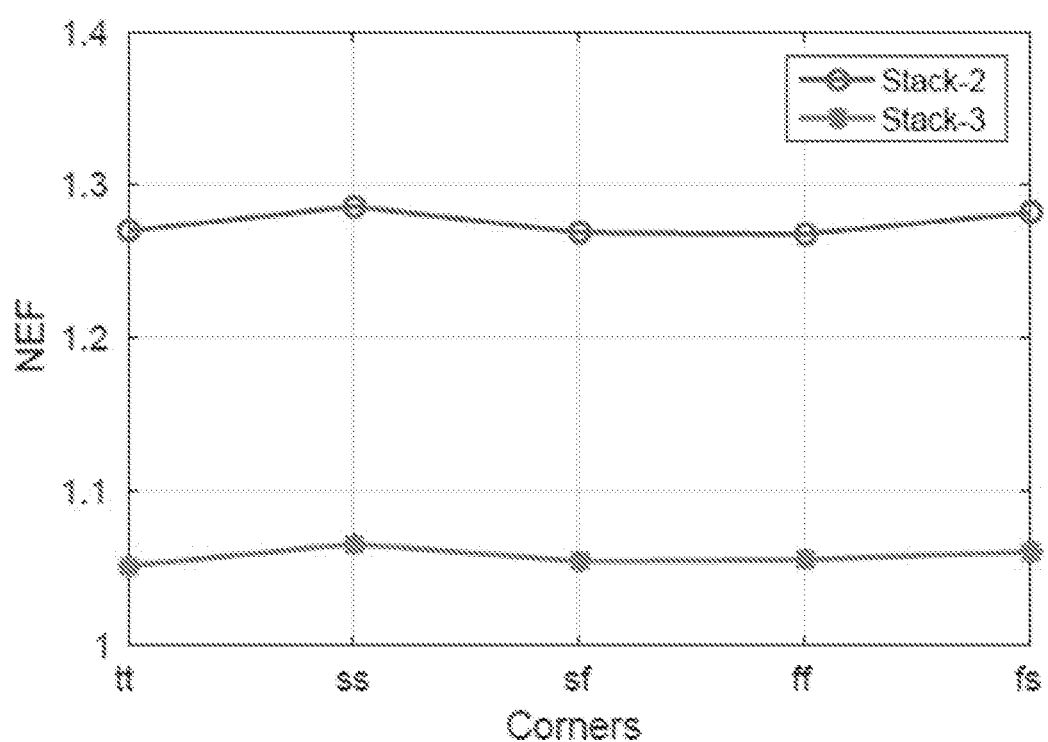
FIG. 11 is a diagram of simulated NEF performance across corners of the 2-stacked inverter stack array and the 3-stacked inverter stack array, in accordance with an illustrative embodiment.

The open-loop gain of the amplifier is designed to be 76 dB. CS and CF are chosen to be 8 pF and 400 fF, respectively, leading to the nominal closed-loop gain of 26 dB. The SPICE simulated closed-loop NEF for the stack-2 and stack-3 versions are 1.26 and 1.07, respectively. FIG. 11 shows the simulated NEF across different process corners. This consistent result may be attributed to the robust replica-based bias circuit as discussed in relation to FIG. 2C.

Figure 12:
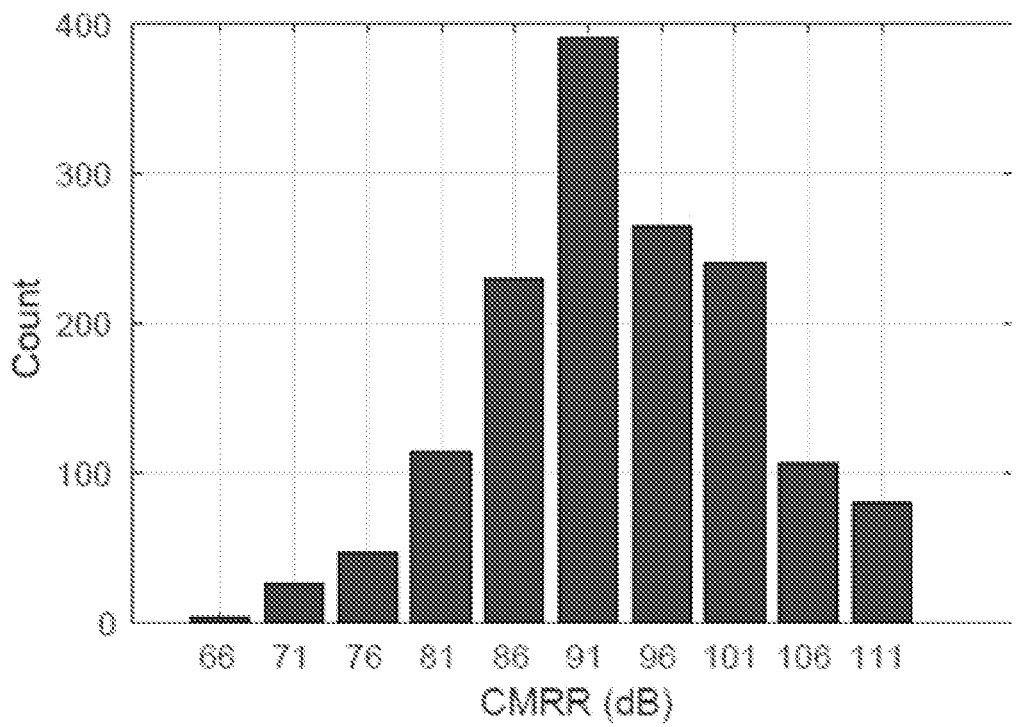
FIG. 12 shows simulated CMRR distribution among 1500 Monte-Carlo simulations for the 2-stacked inverter stack array, in accordance with an illustrative embodiment.
Figure 13:
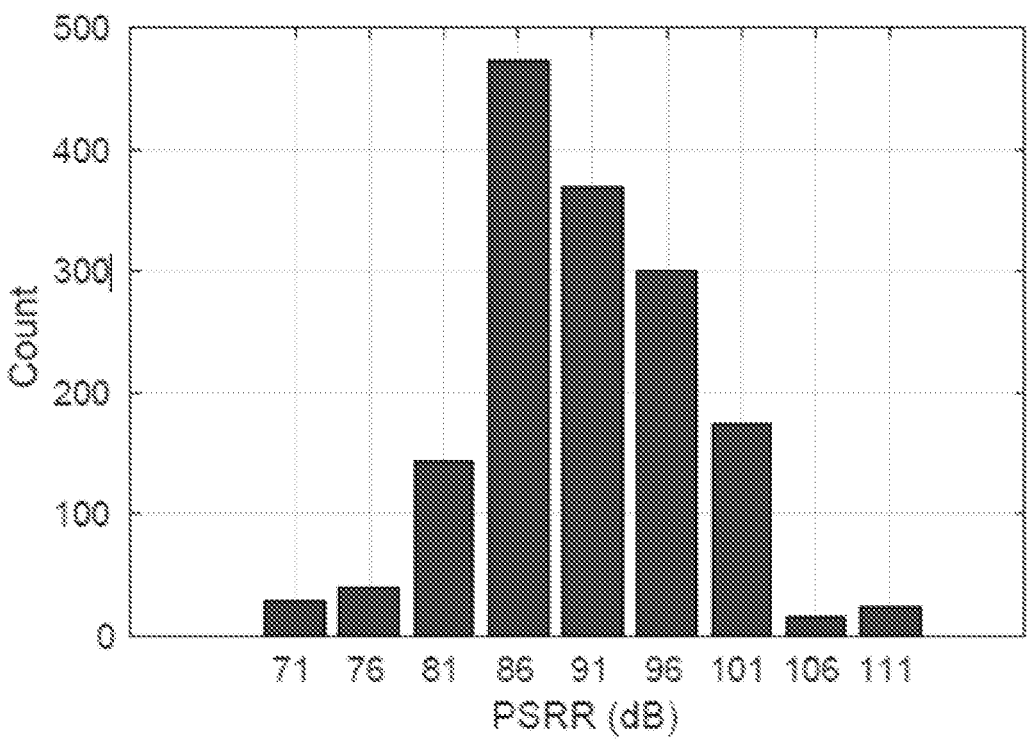
FIG. 13 shows the simulated PSRR distribution among 1500 Monte-Carlo simulations for the 2-stacked inverter stack array, in accordance with an illustrative embodiment.

The simulated CMRR distribution among 1500 Monte-Carlo simulations is shown in FIG. 12. The CMRR is higher than 81 dB assuming the yield of 90%. FIG. 13 shows the simulated PSRR distribution. The PSRR is higher than 81 dB assuming the yield of 90%. Both CMRR and PSRR simulation results match the analytical results of Equations 8 and 9.

The capacitors CS and CF are implemented, in some embodiments, using MoM capacitors. As shown in FIG. 2G and analyzed using Equation 13, the parasitic capacitances facing the amplifier virtual ground node can degrade the noise performance. To minimize parasitic capacitance, a poly-silicon layer, in some embodiments, is inserted below the MoM capacitor. The layer, in some embodiments, connects with the capacitor side that faces away from the virtual ground. Although the parasitic capacitance from the plate associated with the poly-silicon layer to the substrate may be increased, the layer significantly reduces the overall parasitic capacitance of the other virtual-ground connecting plate by isolating it from the substrate. Parasitic extraction results have shown that this layout technique reduces the parasitic capacitance by 50% and improves the NEF by 17%.

Example: 3-Stack Inverter Stack Array

FIG. 10A is a diagram of an N-stack inverter-stack array of FIG. 1 configured as a 3-stack inverter array, in accordance with an illustrative embodiment. Similar to the 2-stack structures (e.g., 202, 204) shown in FIG. 2A, the 3-stack structure includes a third inverter-based transconductor 1002 vertically stacked with respect to the first inverter-based transconductor (e.g., 202).

The third inverter-based transconductor 1002 is coupled to a third common-gate transistors 1004 that couples in parallel with the common-gate transistors 210 of the first inverter-based transconductor to the common-gate transistors 212 of the second inverter-based transconductor 204. The third common-gate transistors 1004 in conjunction with the common-gate transistors 210, 212 combine current outputted from the third inverter-based transconductor along with the current output of the first and second inverter-based transconductors for the outputs 110a, 110b and for the capacitive feedback network.

As shown in FIG. 10A, all resisters (1006a-1006f) are connected to a bias circuit (e.g., as provided in FIG. 2A). To this end, other side of the input is connected to $V_{in}$ through a capacitor topology as in $V_{ip}$. Three common-gate branches are used to aggregate the signal-signal current from all 6 input pairs. Therefore, the overall transconductance of this amplifier is $6g_m$. This topology can be further expanded out to stack-N version. The general approach of embedding the proposed inverter stacking amplifier inside a capacitive feedback loop is shown in FIG. 1. Similar to FIG. 7, capacitors CS and CF are split up and reused as AC coupling capacitors. For the open-loop and closed-loop small-signal gain, noise, offset, CMRR, and PSRR, they can be derived following the same method as explained in Section III. For brevity, we leave them out here.

Compared to the 2-stacked inverter amplifier, the 3-stacked inverter amplifier can increase $g_m$, leading to a better NEF. For practical applications, the optimum stacking number is likely to be either 2 or 3, but more than 3 stacking inverters can be used. It is contemplated that a fourth, fifth, sixth, and etc. inverter-based transconductor and corresponding common-gate transistor can be coupled to the inverter stack array, as demonstrated herein (e.g., see FIGS. 2A, 2B and 10A, 10B), to form an N-stack inverter-stack array.

Discussion of Exemplified Inverter Amplifier

The methods, systems and processes described herein may be used to boost the overall amplifier transconductance $g_m$, while doing so without increasing the bias current $I_D$. The overall amplifier $g_m$, can be doubled, in some embodiments, without requiring any extra bias current (it is shared by both NMOS and PMOS input pairs) by biasing the input transistors in weak inversion to maximize their $g_m = I_D$, and stacking a PMOS input pair on top of an NMOS input pair to form an inverter based input stage (further increase $g_m$). The exemplary amplifier does so without multiple power supplies, which mitigate or remove issues associated with common-mode rejection ratio (CMRR) and power supply rejection ratio (PSRR) degradation, for example, due to its pseudo-differential input pair. The exemplary amplifier can achieve 2-time current reuse while operating the amplifier first-stage under a low voltage of 0.2 V without use of an extra DC-DC converters for multiple power supplies, thus reducing hardware complexity, die size, and power costs. The exemplary amplifier can boost the level of current reuse, allowing N-time current reuse among N-channel inputs in an efficient matter that can be used in a single-channel, for example, without 2N number of output branches to combine, which could lead to increased complexity and power of the peripheral circuits. The exemplary amplifier can be used in a practical closed-loop configuration while ensuring an accurate gain and high linearity while not requiring complicated demodulation and filters to attenuate the ripple (which can increase the overall complexity and requires additional power and area).

Discussion of Noise Efficiency Factor and Current Reuse

In a basic fully-differential common-source amplifier, the input referred thermal noise power spectral density (PSD) can be calculated as Equation 16.

$$N_{PSD} = \frac{8kT\gamma}{g_{m1}}\left(1 + \frac{g_{m2}}{g_{m1}}\right) \quad \text{(Equation 16)}$$

where k is the Boltzmann constant, is the noise model parameter. The power consumption is given by Equation 17.

$$P = V_{DD} \cdot I_{tot} \quad \text{(Equation 17)}$$

where $V_{DD}$ denotes the supply voltage, $I_{tot}$ denotes the total current consumption. Thus, its power and noise product is given by Equation 18.

$$P \cdot N_{PSD} = 8kT\gamma \cdot V_{DD} \cdot \frac{I_{tot}}{g_{m1}}\left(1 + \frac{g_{m2}}{g_{m1}}\right) \quad \text{(Equation 18)}$$

An example basic fully-differential common-source amplifier is described in Linxiao Shen, Nanshu Lu, and Nan Sun, "A 1-V 0.25-uW Inverter Stacking Amplifier with 1.07 Noise Efficiency Factor", IEEE Journal of Solid-State Circuit, Vol. 53, Issue 3, 2018, which is incorporated by reference herein in its entirety.

To achieve a higher power efficiency and minimize the power-noise product, classic design techniques may include:

1) biasing the input transistors in weak inversion to maximize $g_m = I_D$; and 2) biasing the load transistors in strong inversion to decrease its $g_m/I_D$ and thus reduce $g_{m2}/g_{m1}$. Sometimes when $V_{DD}$ is tunable, it is lowered as much as possible to reduce power, but there is usually restriction due to signal swing requirement and system level consideration.

Noise efficiency factor (NEF) can be used to characterize the power or noise efficiency of an amplifier. NEF can, for example, be calculated by Equation 19.

$$NEF = v_{ni,rms} \sqrt{\frac{2}{\pi} \cdot \frac{I_{tot}}{V_T \cdot 4kT \cdot BW}} \quad \text{(Equation 19)}$$

where is the input referred rms noise of the amplifier in a given bandwidth BW, and $V_T$ is the thermal voltage given by kT/q. NEF can be defined as a unit-less ratio as provided in Equation 4, which is easy for comparison. In Equation 4, the power and noise product of a given amplifier is normalized against that of a single bipolar transistor. NEF is usually greater than 1 for a typical MOSFET amplifier because: 1) $g_m/I_D$ of a MOSFET is smaller than that of a bipolar transistor; 2) MOSFET produces much larger 1/f noise; 3) a practical amplifier typically has other devices that contribute noise and consume power. Assuming the amplifier noise is dominated by thermal noise, the NEF of any differential amplifier can be simplified to Equation 20.

$$NEF = \sqrt{4\gamma \cdot \alpha \cdot \eta \cdot \frac{q/kT}{m \cdot g_m/I_D}} \approx \sqrt{\frac{4\gamma \cdot \alpha \cdot \eta \cdot n}{m}} \quad \text{(Equation 20)}$$

where $\alpha$ is the noise excess factor defined as the total amplifier noise normalized against the noise from the input transistors (if $\alpha=1$, noise from all other devices can be ignored), $\eta$ is the current excess factor defined as the total amplifier current divided by the current of the input transistor (if $\eta=1$, all bias current goes through the input pair), and m is the current reuse times (m=1 for a fully differential common-source amplifier). In simplifying Equation 5, the input transistors can be assumed to be biased in the sub-threshold region where $$\frac{q/kT}{g_m/I_D}$$

is equal to the subthreshold slope factor n. As a result, the theoretical lower bound of the NEF for the amplifier for a basic fully-differential common-source amplifier can be about 2 assuming $\gamma=0.7$, $\alpha=\eta=1$, and n=1.4. For a realistic amplifier assuming the input pair consumes 80% of the total current (i.e., n=1.25) and contributes 80% of the total noise (i.e., $\alpha=1.25$), the practical lower bound of NEF is about 2.5.

To improve the amplifier power efficiency and minimize NEF, $g_m$ should be boosted but doing so without increasing the amplifier current. One effective way is through current reuse. An inverter-based amplifier can reuse its bias current for both NMOS and PMOS input pairs. Assuming both pairs have the same transconductance, the overall amplifier $g_m$ can be doubled for the same bias current, leading to a 2-time reduction in noise power and a 1.4-time reduction in NEF. One tradeoff of using an inverter based amplifier is a reduced output signal swing, but this can be alleviated by adding a second stage amplifier that follows it. Other tradeoff can include: 1) increased requirement on the power supply voltage; 2) increased input capacitance; and 3) reduced input common-mode range, which may be acceptable for certain applications, for example, when power efficiency is critical.

Nevertheless, if current reuse can be achieved more times (i.e., increasing m), then $g_m$ can be further boosted and NEF can be further reduced. To calculate the practical limit, $\alpha=\eta=1.25$ can be assumed. Indeed, 4-time and 6-time current reuse would reduce the practical NEF lower bound to 1.25 and 1, respectively, indicating significant power reduction.

Without wishing to be bound to a particular theory, one direct way of achieving more times of current reuse is to vertically stack inverter based amplifiers. In this manner, the bias current is reused 4 times, thus boosting $g_m$ by 4 times. Nonetheless, directly stacking inverters can bring several challenges. The required minimum power supply voltage, given by $4|V_{gs}|+4|V_{ds}|$, may be larger than a single inverter based amplifier. Further, there may be more than one input node and more than output nodes, and thus, a method may be needed to couple the amplifier input to all input pairs and to aggregate for all small-signal currents, while not sacrificing CMRR, PSRR, as well as PVT robustness.

The methods, systems and processes described herein may be used to reduce amplifier power while keeping the same noise level, which can be beneficial for a wide range of power and energy constrained applications. For example, the methods, systems and processes described herein can be used to ensure long lifetime operation of remote sensor devices (e.g., IoT devices) without battery replacement by providing an amplifier that is ultralow. Similarly, methods, systems and processes described herein may be used for biomedical implants, which can have a stringent requirement on the amplifier power, e.g., due to limited battery size as well as safety concerns regarding heat dissipation.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification. Throughout this application, various publications are referenced. The disclosures of these publications in their entireties are hereby incorporated by reference into this application in order to more fully describe the state of the art to which the methods and systems pertain.

What is claimed is:

1. An apparatus comprising an array of N stacked inverters having capacitive feedback split across N feedback paths to provide 2N-time current reuse for a single channel input, the apparatus comprising:
    an array of inverter-based transconductors comprising a first inverter-based transconductor and a second inverter-based transconductor vertically stacked with respect to the first inverter-based transconductor, the array of inverter-based transconductors being coupled to a summing circuit configured to combine currents outputted from each respective inverter-based transconductor of the array; and a capacitive feedback network comprising a plurality of capacitive elements, wherein the capacitive feedback network is coupled to the combined current outputs of the array of inverter-based transconductor and is split into paths corresponding to a number of inverter-based transconductor in the array such that a voltage input stage of the array of inverter-based transconductor is AC-coupled to each invertor-based transconductor stage of the array.

2. The apparatus of claim 1, wherein the array of inverter-based transconductors comprises
a third inverter-based transconductor, the third inverter-based transconductor being vertically stacked with respect to the first inverter-based transconductor, the third inverter-based transconductor being coupled to a common-gate transistors of the plurality of common-gate transistors to combine current outputted from the third inverter-based transconductor along with the current output of the first and second inverter-based transconductors.

3. The apparatus of claim 1, wherein the apparatus is configured to generate 2N times current reuse for an N-stage inverter-based transconductor array.

4. The apparatus of claim 3, wherein the apparatus is configured to generate 6 times current reuse for a 3-stage inverter-based transconductor array.

5. The apparatus of claim 1, wherein the summing circuit comprises a plurality of common-gate transistors configured to combine currents outputted from each respective inverter-based transconductor of the array.

6. The apparatus of claim 3, wherein the N-stage inverter-based transconductor array is selected from the group consisting of a 2-stage inverter-based transconductor array, a 3-stage inverter-based transconductor array, a 4-stage inverter-based transconductor array, a 5-stage inverter-based transconductor array, and a 6-stage inverter-based transconductor array.

7. The apparatus of claim 1, wherein each inverter-based transconductor of the array comprises an N-MOS pair forming a top inverter and a P-MOS pair coupled to the N-MOS pair to form a bottom inverter.

8. The apparatus of claim 1, wherein the invertor-based transconductor stage is configured to receive a differential-mode input.

9. The apparatus of claim 1, wherein connection nodes between the first inverter-based transconductor and a second inverter-based transconductor are used as a virtual ground.

10. The apparatus of claim 1, wherein the invertor-based transconductor stage is configured to receive a common-mode input.

11. The apparatus of claim 1, wherein the apparatus is configured to generate a gain of an input signal between about 25.4 dB and about 25.6 dB with about 0.23 µW and 0.25 µW of power.

12. The apparatus of claim 1, wherein the array of inverter-based transconductors has N outputs corresponding to an N number of inverter stages.

13. The apparatus of claim 1, comprising a first current source and a second current source, the first and second current sources being coupled to a top node and a bottom node array of inverter-based transconductors to isolate the array from respective power lines.

14. The apparatus of claim 1, wherein the array of inverter-based transconductors is coupled to a same single power supply.

15. The amplifier of claim 1, wherein the apparatus forms an integrated circuit.

16. An amplifier comprising:
an array of N stacked inverters having capacitive feedback split across N feedback paths to provide 2N-time current reuse for a single channel input, each N stack inverter of the array comprising an inverter-based transconductors vertically stacked with respect to each other, the array of inverter-based transconductors being coupled to a summing circuit configured to combine currents outputted from each respective inverter-based transconductor of the array; and
a capacitive feedback network comprising a plurality of capacitive elements, wherein the capacitive feedback network is coupled to the combined current outputs of the array of inverter-based transconductor and is split into paths corresponding to a number of inverter-based transconductor in the array such that a voltage input stage of the array of inverter-based transconductor is AC-coupled to each invertor-based transconductor stage of the array.

17. The amplifier of claim 16, wherein the amplifier is configured to generate 2N times current reuse for an N-stage inverter-based transconductor array.

18. The amplifier of claim 16, wherein the array of inverter-based transconductors has N outputs corresponding to an N number of inverter stages.

19. A system comprising:
a sensor; and
an amplifier, the amplifier comprising an array of N stacked inverters having capacitive feedback split across N feedback paths to provide 2N-time current reuse for a single channel input, each N stack inverter of the array comprising an inverter-based transconductors vertically stacked with respect to each other, the array of inverter-based transconductors being coupled to a summing circuit configured to combine currents outputted from each respective inverter-based transconductor of the array; and
a capacitive feedback network comprising a plurality of capacitive elements, wherein the capacitive feedback network is coupled to the combined current outputs of the array of inverter-based transconductor and is split into paths corresponding to a number of inverter-based transconductor in the array such that a voltage input stage of the array of inverter-based transconductor is AC-coupled to each invertor-based transconductor stage of the array.

20. The system of claim 19, wherein the amplifier is configured to generate 2N times current reuse for an N-stage inverter-based transconductor array.

* * * * *